US011936351B2

(12) United States Patent
Chen et al.

(10) Patent No.: US 11,936,351 B2
(45) Date of Patent: Mar. 19, 2024

(54) SYSTEMS AND METHODS FOR ERROR AMPLIFICATION AND PROCESSING

(71) Applicant: ON-BRIGHT ELECTRONICS (SHANGHAI) CO., LTD., Shanghai (CN)

(72) Inventors: Yaozhang Chen, Shanghai (CN); Xiangkun Zhai, Shanghai (CN); Liqiang Zhu, Shanghai (CN); Lieyi Fang, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 17/148,219

(22) Filed: Jan. 13, 2021

(65) Prior Publication Data

US 2021/0226596 A1    Jul. 22, 2021

(30) Foreign Application Priority Data

Jan. 16, 2020  (CN) .......................... 202010046603.0
Jul. 28, 2020  (CN) .......................... 202021524269.7

(51) Int. Cl.
*H03F 3/45* (2006.01)
*H03K 21/08* (2006.01)
*H03M 1/66* (2006.01)

(52) U.S. Cl.
CPC ... *H03F 3/45076* (2013.01); *H03F 2200/129* (2013.01); *H03F 2203/45116* (2013.01); *H03K 21/08* (2013.01); *H03M 1/66* (2013.01)

(58) Field of Classification Search
CPC ........... H03F 3/45076; H03F 2200/129; H03F 2203/45116; H03F 3/45174; H03F 3/217;
(Continued)

(56) References Cited

U.S. PATENT DOCUMENTS 4,096,933 A * 6/1978 Massa ...................... G07F 5/24
                                                      194/327
5,774,433 A * 6/1998 Rokutan ............ G11B 7/08541
                                                    369/53.25
(Continued)

FOREIGN PATENT DOCUMENTS

CN          102290970 A       12/2011
CN          105356730 A        2/2016
(Continued)

OTHER PUBLICATIONS

Abbas, W., Mehmood, Z., & Seo, M. (2020). A V-band phase-locked loop with a novel phase-frequency detector in 65 nm CMOS. Electronics, 9(9), 1502. doi:https://doi.org/10.3390/electronics9091502 (Year: 2020).*

(Continued)

*Primary Examiner* — Lincoln D Donovan
*Assistant Examiner* — Tyler J Pereny
(74) *Attorney, Agent, or Firm* — Faegre Drinker Biddle & Reath LLP

(57) ABSTRACT

System and method for error amplification and processing. For example, the system includes: a signal processing unit configured to receive a reference signal and a feedback signal and generate a digital pulse signal, a frequency of the digital pulse signal being associated with a difference between the reference signal and the feedback signal; a counter configured to receive the digital pulse signal and generate a counter output signal based on at least information associated with the digital pulse signal; and a digital-to-analog converter configured to receive the counter output signal and generate an output signal based on at least information associated with the counter output signal.

23 Claims, 10 Drawing Sheets

(58) Field of Classification Search
CPC .......... H03F 2203/45048; H03F 3/187; H03F
2200/165; H03F 2203/45528; H03F
2203/45512; H03F 2200/411; H03F 3/45;
H03F 2200/375; H03F 2200/03; H03F
3/45475; H03K 21/08; H03K 7/10; H03K
7/08; H03K 7/06; H03K 21/02; H03M
1/66; H03M 3/432; H03M 3/38; H03M
1/08; H03M 1/0624; G01C 19/5614;
G01C 19/5776

See application file for complete search history.

(56) References Cited

U.S. PATENT DOCUMENTS

| | | | |
|---|---|---|---|
| 10,181,791 B2* | 1/2019 | Kesarwani | ............. G05B 11/42 |
| 10,425,002 B2* | 9/2019 | Yao | ........................... H03F 3/45 |
| 2003/0006920 A1* | 1/2003 | Mori | ................... H03F 3/45183 |
| | | | 341/118 |
| 2008/0024209 A1 | 1/2008 | Gibson | |
| 2016/0276038 A1* | 9/2016 | Kanda | .................... G11C 16/10 |

FOREIGN PATENT DOCUMENTS

| | | |
|---|---|---|
| CN | 109217667 A | 1/2019 |
| TW | 201532376 A | 8/2015 |
| WO | 2017/097260 A1 | 6/2017 |

OTHER PUBLICATIONS

Taiwan Intellectual Property Office, Office Action dated Apr. 30, 2020, in Application No. 109111040.

Chen et al., "Design of A High-efficient PWM Control Circuit Application for DC/DC Converter," China Integrated Circuit, 20(8), (2011), pp. 46-52.

Chinese Patent Office, Office Action dated Mar. 22, 2023, in Application No. 202010046603.0.

* cited by examiner

SYSTEMS AND METHODS FOR ERROR AMPLIFICATION AND PROCESSING

1. CROSS-REFERENCES TO RELATED APPLICATIONS

This application claims priority to Chinese Patent Application No. 202010046603.0, filed on Jan. 16, 2020 and Chinese Patent Application No. 202021524269.7, filed on Jul. 28, 2020, both of which are incorporated by reference herein for all purposes.

2. BACKGROUND OF THE INVENTION

Certain embodiments of the present invention are directed to circuits. Certain embodiments of the present invention are directed to integrated circuit. More particularly, some embodiments of the disclosure provide systems and methods for error amplification and processing. Merely by way of example, some embodiments of the disclosure have been applied to power system and/or signal processing system. But it would be recognized that the invention has a much broader range of applicability.

FIG. 1 is a schematic diagram of a conventional pulse width modulation (PWM) and/or pulse frequency modulation (PFM) control system 100 for error amplification and processing. As shown in FIG. 1, the control system 100 includes an error amplifier 110, a compensation unit 120, a PWM and/or PFM control unit 130, a driver unit 140, a signal and/or power conversion unit 150, and a feedback detection unit 160. In some cases, the PWM and/or PFM control unit 130 can be a PWM control unit, a PFM control unit, or a PWM and PFM control unit.

The reference voltage 102 (e.g., Vref) and the feedback signal 104 (e.g., FB) are coupled to the two input terminals of the error amplifier 110. For example, the reference voltage 102 can be connected to the positive input terminal of the error amplifier 110 and the feedback signal 104 can be connected to the negative input terminal of the error amplifier 110. As an example, the reference voltage 102 can be connected to the negative input terminal of the error amplifier 110 and the feedback signal 104 can be connected to the positive input terminal of the error amplifier 110. In the conventional control system 100, the error amplifier 110 is a transconductance amplifier. The error amplifier 110 performs amplification to the difference between the reference voltage 102 and the feedback signal 104 and generates an output current 112 that is proportional to the difference between the reference voltage 102 and the feedback signal 104. The output terminal of the error amplifier 110 is coupled to the compensation unit 120, such that the output signal 112 of the error amplifier 110 is input to the compensation unit 120.

The compensation unit 120 is used in a loop compensation of the control system 100 to maintain system stability. The compensation unit 120 includes a capacitor 125 (e.g., C0) connected to the output terminal of the error amplifier 110 at a first capacitor terminal of the capacitor 125 and connected to ground at a second capacitor terminal of the capacitor 125, where the first capacitor terminal is different from the second capacitor terminal. The compensation unit 120 receives the output signal 112 of the error amplifier 110 and generates a compensation signal 122. The output terminal of the error amplifier 110 is connected to the PWM and/or PFM control unit 130 via the compensation unit 120, such that the output signal 112 of the error amplifier 110, after being compensated by the compensation unit 120, is input to the PWM and/or PFM control unit 130. The PWM and/or PFM control unit 130 processes the output signal 112 of the error amplifier 110 to generate a modulation signal 132. The modulation signal 132 generated by the PWM and/or PFM control unit 130 is output to the driver unit 140. The driver unit 140 amplifies the modulation signal 132 and generates a drive signal 142 for driving signal and/or power conversion.

The signal and/or power conversion unit receives the drive signal 142. The signal and/or power conversion unit 150 generates an output signal 152 provided to the feedback detection unit 160. The feedback detection unit 160 receives the output signal 152 of the signal and/or power conversion unit 150 and generates the feedback signal 104 (e.g., FB).

As shown in FIG. 1, the control system 100 includes the capacitor 125 (e.g., C0) to provide a control compensation loop. When the input signal is a low-frequency signal (e.g., a 50-60 Hz AC signal), in order to achieve system stability, a low bandwidth control loop (e.g., around 10 Hz, a bandwidth of 5 to 50 Hz) is used for compensation. In such implementations, the capacitor 125 (e.g., C0) in the compensation unit 120 is a large capacitor with capacitance value in the magnitude of microfarads (μF), where such large capacitor cannot be incorporated into an integrated circuit. In such implementations, an external capacitor needs to be used outside the integrated circuit, which can have adverse effects on the cost and reliability of the control system.

Hence it is highly desirable to improve the techniques related to error amplification and processing.

3. BRIEF SUMMARY OF THE INVENTION

Certain embodiments of the present invention are directed to circuits. Certain embodiments of the present invention are directed to integrated circuit. More particularly, some embodiments of the disclosure provide systems and methods for error amplification and processing. Merely by way of example, some embodiments of the disclosure have been applied to power system and/or signal processing system. But it would be recognized that the invention has a much broader range of applicability.

According to some embodiments, a system for error amplification and processing includes: a signal processing unit configured to receive a reference signal and a feedback signal and generate a digital pulse signal, a frequency of the digital pulse signal being associated with a difference between the reference signal and the feedback signal; a counter configured to receive the digital pulse signal and generate a counter output signal based on at least information associated with the digital pulse signal; and a digital-to-analog converter configured to receive the counter output signal and generate an output signal based on at least information associated with the counter output signal.

According to certain embodiments, a system for error amplification and processing includes: a signal processing unit configured to receive a reference signal and a feedback signal and generate a digital pulse signal, a frequency of the digital pulse signal being associated with a difference between the reference signal and the feedback signal; a counter configured to receive the digital pulse signal and generate a counter output signal based on at least information associated with the digital pulse signal; a digital-to-analog converter configured to receive the counter output signal and generate an output signal based on at least information associated with the counter output signal; and a clamp signal generator configured to receive the output signal and generate a clamp signal based on at least information associated with the output signal.

According to some embodiments, a method for error amplification and processing includes: receiving a reference signal; receiving a feedback signal; generating a digital pulse signal, a frequency of the digital pulse signal being associated with a difference between the reference signal and the feedback signal; receiving the digital pulse signal; generating a counter output signal based on at least information associated with the digital pulse signal; receiving the counter output signal; and generating an output signal based on at least information associated with the counter output signal.

According to certain embodiments, a method for error amplification and processing includes: receiving a reference signal; receiving a feedback signal; generating a digital pulse signal, a frequency of the digital pulse signal being associated with a difference between the reference signal and the feedback signal; receiving the digital pulse signal; generating a counter output signal based on at least information associated with the digital pulse signal; receiving the counter output signal; generating an output signal based on at least information associated with the counter output signal; receiving the output signal; and generating a clamp signal based on at least information associated with the output signal.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

5. DETAILED DESCRIPTION OF THE INVENTION

Certain embodiments of the present invention are directed to circuits. Certain embodiments of the present invention are directed to integrated circuit. More particularly, some embodiments of the disclosure provide systems and methods for error amplification and processing. Merely by way of example, some embodiments of the disclosure have been applied to power system and signal processing system. But it would be recognized that the invention has a much broader range of applicability.

Figure 1:
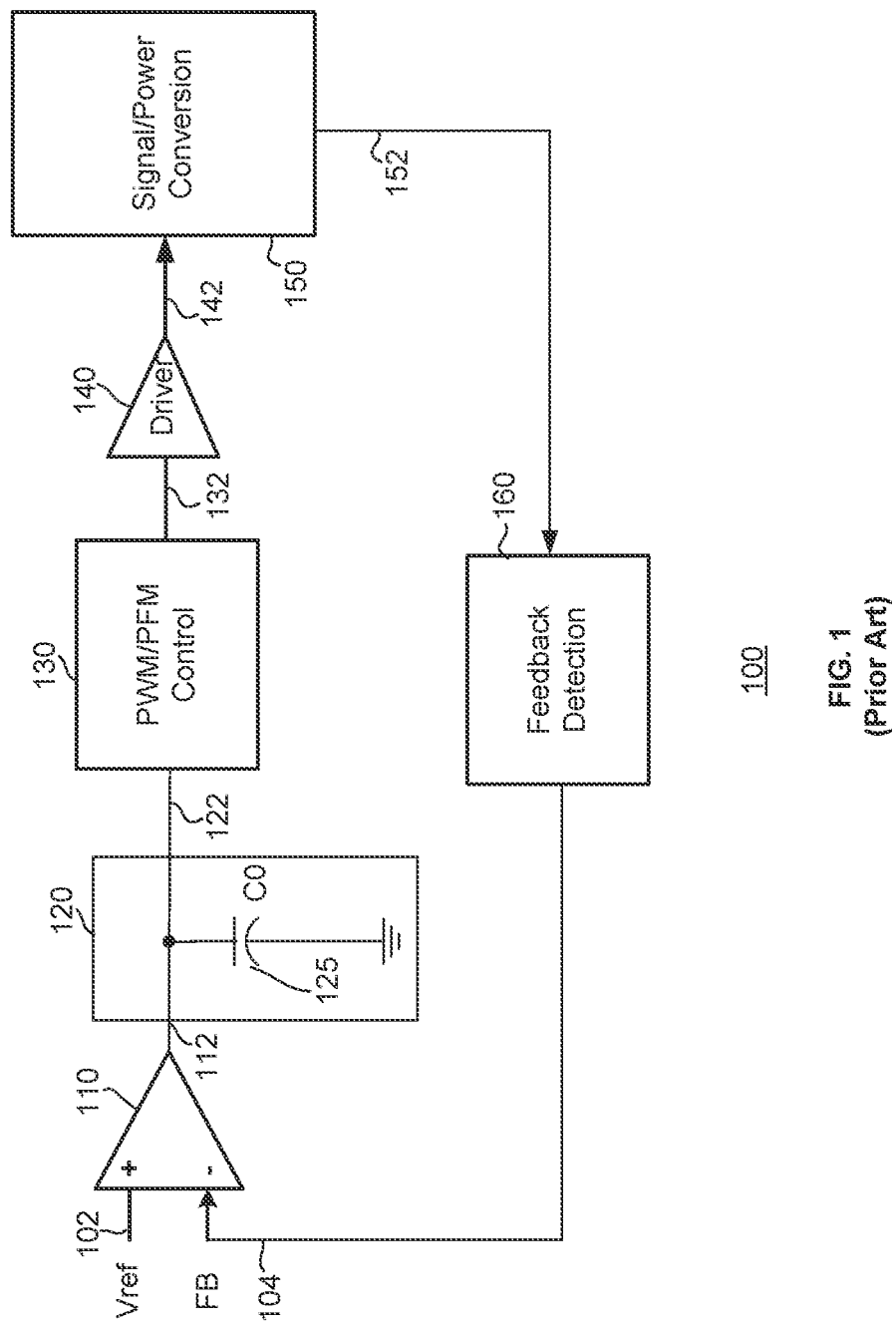
FIG. 1 is a schematic diagram of a conventional pulse width modulation (PWM) and/or pulse frequency modulation (PFM) control system for error amplification and processing.
Figure 2:
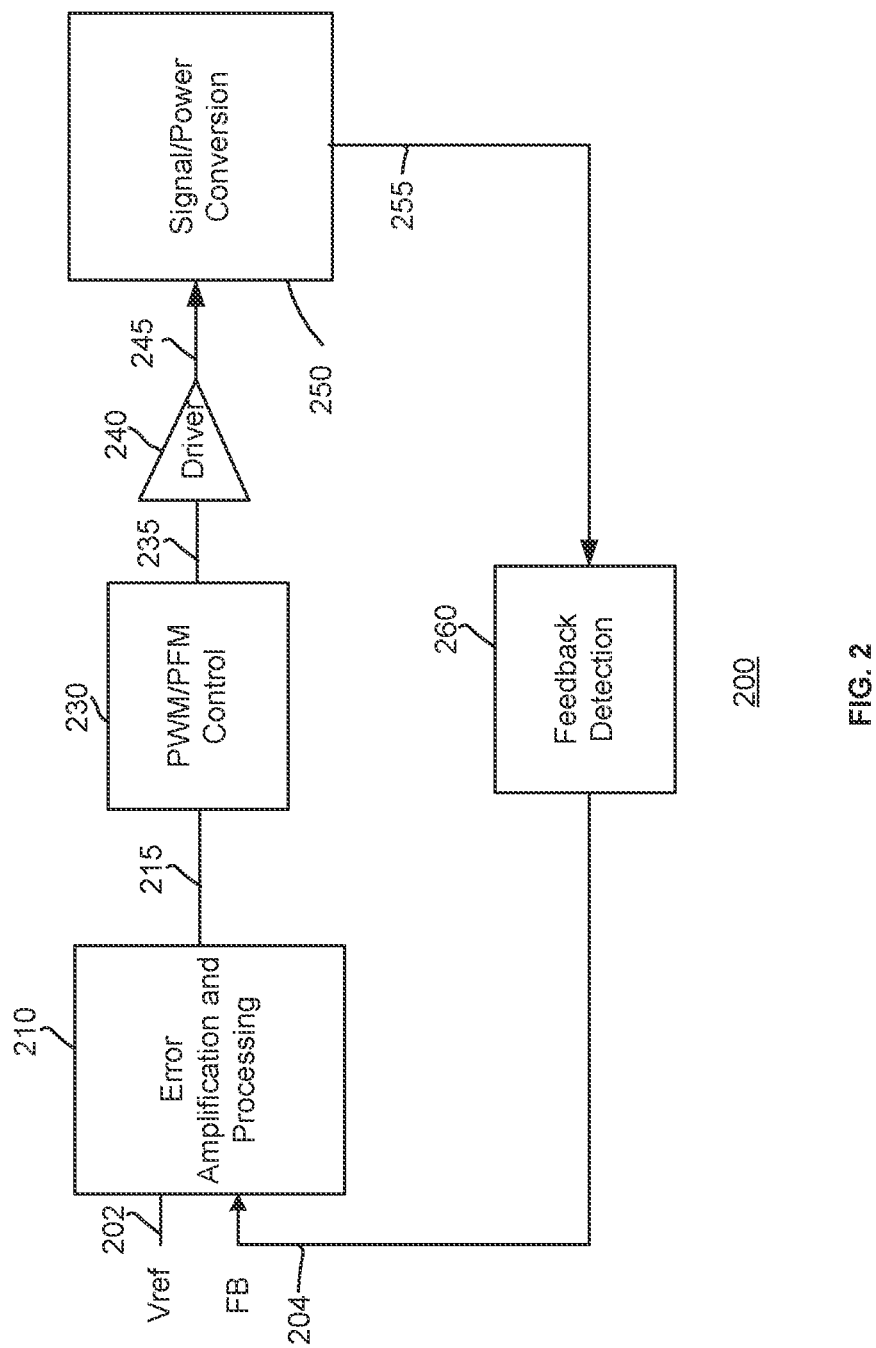
FIG. 2 is a simplified diagram of a modulation control system according to some embodiments of the present invention.

FIG. 2 is a simplified diagram of a modulation control system according to some embodiments of the present invention. This diagram is merely an example, which should not unduly limit the scope of the claims. One of ordinary skill in the art would recognize many variations, alternatives, and modifications. As shown in FIG. 2, the modulation control system 200 includes an error amplification and processing unit 210, a modulation control unit 230, a driver unit 240, a signal and/or power conversion unit 250, and a feedback detection unit 260. In some examples, the modulation control system 200 includes a pulse width modulation (PWM) control system. In certain examples, the modulation control system 200 includes a pulse frequency modulation (PFM) control system. In some examples, the modulation control system 200 includes a PWM and/or PFM control system. Although the above has been shown using a selected group of components for the modulation control system 200, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

In some embodiments, the error amplification and processing unit 210 is configured to receive a reference signal 202 (e.g., $V_{ref}$) and a feedback signal 204 (e.g., FB) and generate an output signal 215 based at least in part on the reference signal 202 and the feedback signal 204. In one embodiment, the error amplification and processing unit 210 includes two input terminals and an output terminal. For example, the two input terminals of the error amplification and processing unit 210 are configured to receive the reference signal 202 and the feedback signal 204 respectively. As an example, the output terminal of the error amplification and processing unit 210 is configured to output the output signal 215. In some examples, the output signal 215 is associated with (e.g., is dependent on) a difference between the reference signal 202 and the feedback signal 204. In certain examples, the output signal 215 is associated with (e.g., is dependent on) a difference in magnitude between the reference signal 202 and the feedback signal 204.

In some examples, the magnitude of the output signal 215 is associated with (e.g., is dependent on) a difference between the reference signal 202 and the feedback signal 204. In certain examples, the magnitude of the output signal 215 is associated with (e.g., is dependent on) a difference in magnitude between the reference signal 202 and the feedback signal 204. In some examples, the error amplification and processing unit 210 is configured to process information associated with the reference signal 202 and the feedback signal 204 to generate the output signal 215. For example, the reference signal 202 is a reference voltage. As an example, the feedback signal 204 is a feedback voltage. In some examples, the output signal 215 is an analog output signal. In certain examples, the error amplification and processing unit 210 is coupled to the modulation control unit 230. In some examples, the output terminal of the error amplification and processing unit 210 is connected to the modulation control unit 230.

In certain embodiments, the modulation control unit 230 is configured to receive the output signal 215 and generate a modulation signal 235 based at least in part on the output signal 215. In some examples, the modulation control unit 230 includes a PWM control unit configured to generate a PWM signal as the modulation signal 235. In certain examples, the modulation control unit 230 includes a PFM control unit configured to generate a PFM signal as the modulation signal 235. In some examples, the modulation control unit 230 includes a PWM and/or PFM control unit configured to generate a PWM and PFM signal as the modulation signal 235.

In some embodiments, the modulation control unit 230 is coupled to the driver unit 240. In some examples, the driver unit 240 is configured to receive the modulation signal 235 and generate a drive signal 245 based at least in part on the modulation signal 235. In certain examples, the driver unit 240 is configured to process the modulation signal 235 to generate the drive signal 245. In some examples, the driver unit 240 is configured to amplify the modulation signal 235 to generate the drive signal 245. In certain examples, the driver unit 240 is coupled to the signal and/or power conversion unit 250.

In certain embodiments, the signal and/or power conversion unit 250 is configured to receive the drive signal 245 and generate an indication signal 255. In some examples, the signal and/or power conversion unit 250 receives the drive signal 245, performs a signal conversion, and generate a system output signal based at least in part on the signal conversion. For example, the signal and/or power conversion unit 250 also generates the indication signal 255 that represents the system output signal. As an example, the indication signal 255 is proportional to the system output signal in magnitude. In certain examples, the signal and/or power conversion unit 250 receives the drive signal 245, performs a power conversion, and generate a system output signal based at least in part on the power conversion. For example, the signal and/or power conversion unit 250 also generates the indication signal 255 that represents the system output signal. As an example, the indication signal 255 is proportional to the system output signal in magnitude. In some examples, the signal and/or power conversion unit 250 receives the drive signal 245, performs a signal and power conversion, and generate a system output signal based at least in part on the signal and power conversion. For example, the signal and/or power conversion unit 250 also generates the indication signal 255 that represents the system output signal. As an example, the indication signal 255 is proportional to the system output signal in magnitude.

As shown in FIG. 2, the signal and/or power conversion unit 250 generates the indication signal 255 based at least in part on the drive signal 245 according to some embodiments. In certain examples, the indication signal 255 is affected by the drive signal 245. In some embodiments, the signal and/or power conversion unit 250 is configured to use the drive signal 245 to drive a power switch, which affects the system output signal and the indication signal 255. In some examples, the signal and/or power conversion unit 250 includes a power conversion unit configured to use the drive signal 245 to control power generation and/or processing. In certain examples, the signal and/or power conversion unit 250 includes a signal conversion unit configured to use the drive signal 245 to control signal generation and/or processing.

In some examples, the signal and/or power conversion unit 250 is coupled to the feedback detection unit 260. In some embodiments, the feedback detection unit 260 is configured to receive the indication signal 255 and generate the feedback signal 204 (e.g., FB) based at least in part on the indication signal 255. In some examples, the feedback signal 204 is generated based on at least information associated with the indication signal 255. In certain examples, the feedback signal 204 is proportional to the indication signal 255 in magnitude.

In certain embodiments, the modulation control system 200 includes the error amplification and processing unit 210 for error signal amplification and processing. For example, the error signal represents a difference between the reference signal 202 and the feedback signal 204. As an example, the error signal represents a difference in magnitude between the reference signal 202 and the feedback signal 204. In some examples, the error amplification and processing unit 210 can realize high-precision signal amplification and conversion for low-bandwidth loop compensation through a control circuit with low capacitance (e.g., 5 picofarads to 100 picofarads).

In some embodiments, the error amplification and processing unit 210 is integrated into an integrated chip (IC). In some examples, at least a part of the error amplification and processing unit 210 is integrated into an integrated chip (IC). In certain examples, the error amplification and processing unit 210, the control unit 220, and the driver unit 240 are integrated into an integrated circuit. In some examples, the error amplification and processing unit 210, the control unit 220, the driver unit 240, and the signal and/or power conversion unit 250 are integrated into an integrated circuit. In certain examples, the error amplification and processing unit 210, the control unit 220, the driver unit 240, and the feedback detection unit 260 are integrated into an integrated circuit. For example, the error amplification and processing unit 210, the control unit 220, the driver unit 240, the signal and/or power conversion unit 250, and the feedback detection unit 260 are integrated into an integrated circuit. In some examples, the modulation control system 200 can be realized without the need to use additional capacitors external to an integrated chip, which can reduce the number of parts in the modulation control system 200, the physical size of the modulation control system 200, and/or reduce the manufacturing cost. As an example, certain components of the modulation control system 200 integrated into a single integrated chip can prevent the certain components from being influenced by operation environments and can extend the life of the control system.

As discussed above and further emphasized here, FIG. 2 is merely an example, which should not unduly limit the scope of the claims. One of ordinary skill in the art would recognize many variations, alternatives, and modifications. For example, the modulation control unit 230 includes a pulse width modulation (PWM) control unit configured to receive an analog signal to generate the modulation signal 235. As an example, the modulation control unit 230 includes a pulse frequency modulation (PFM) unit configured to receive an analog signal and generate the modulation signal 235. For example, the signal and/or power conversion unit 250 includes a signal conversion unit configured to receive the drive signal 245, conduct signal processing based at least in part on the drive signal 245, and generate the indication signal 255. As an example, the signal and/or power conversion unit 250 includes a power conversion unit configured to receive the drive signal 245, conduct power conversion based at least in part on the drive signal 245, and generate the indication signal 255.

Figure 3:
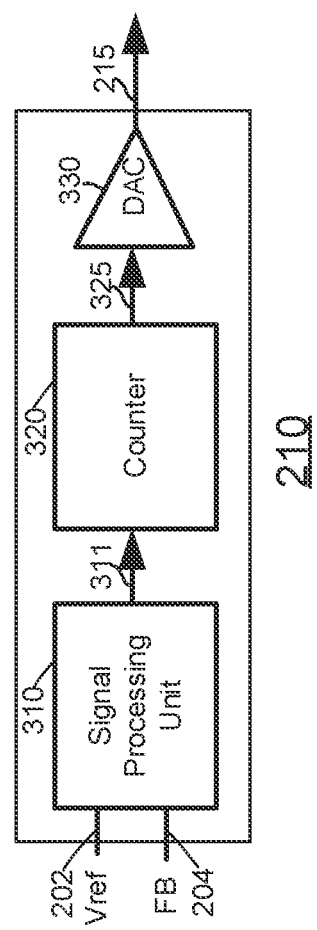
FIG. 3 is a simplified diagram showing certain components of the error amplification and processing unit as part of the modulation control system as shown FIG. 2 according to certain embodiments of the present invention.

FIG. 3 is a simplified diagram showing certain components of the error amplification and processing unit 210 as part of the modulation control system 200 as shown in FIG. 2 according to certain embodiments of the present invention. This diagram is merely an example, which should not unduly limit the scope of the claims. One of ordinary skill in the art would recognize many variations, alternatives, and modifications. As shown in FIG. 3, the error amplification and processing unit 210 includes a signal processing unit 310, a counter unit 320, and a digital-to-analog conversion (DAC) unit 330. Although the above has been shown using a selected group of components for the error amplification and processing unit 210, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

In some embodiments, the signal processing unit 310 is configured to receive a reference signal 202 (e.g., $V_{ref}$) and a feedback signal 204 (e.g., FB) and generate a digital pulse signal 311 based at least in part on the reference signal 202 and the feedback signal 204. In some examples, the signal processing unit 310 includes two input terminals and an output terminal. For example, the two input terminals of the signal processing unit 310 are configured to receive the reference signal 202 and the feedback signal 204 respectively. As an example, the output terminal of the signal processing unit 310 is configured to output the digital pulse signal 311. In certain examples, the signal processing unit 310 is configured to process the reference signal 202 and the feedback signal 204 and perform an analog-to-digital conversion.

In some examples, the digital pulse signal 311 is associated with a difference between the reference signal 202 and the feedback signal 204. In certain examples, the digital pulse signal 311 is associated with a difference in magnitude between the reference signal 202 and the feedback signal 204. In some examples, the digital pulse signal 311 is associated with a voltage difference between the reference signal 202 and the feedback signal 204. In certain examples, the frequency of the digital pulse signal 311 is associated with a difference between the reference signal 202 and the feedback signal 204. In some examples, the frequency of the digital pulse signal 311 is associated with a difference in magnitude between the reference signal 202 and the feedback signal 204. In certain examples, the frequency of the digital pulse signal 311 is based at least in part on a comparison between the reference signal 202 and the feedback signal 204. In some examples, the signal processing unit 310 is configured to process information associated with the reference signal 202 and the feedback signal 204 to generate the digital pulse signal 311. In some examples of the signal processing unit 310 is coupled to the counter unit 320. In certain examples, the output terminal of the signal processing unit 310 is coupled to the counter unit 320.

In certain embodiments, the counter unit 320 is configured to receive the digital pulse signal 311 and generate the counter output signal 325 based at least in part on the digital pulse signal 311. In some examples, the counter unit 320 is configured to perform addition counting and/or subtraction counting based at least in part on the digital pulse signal 311 and generate the counter output signal 325. In certain examples, the counter output signal 325 is a digital signal. In some examples, the counter unit 320 includes a counter input terminal and a counter output terminal. For example, the counter unit 320 is configured to receive the digital pulse signal 311 at the counter input terminal. As an example, the counter unit 320 is configured to generate the counter output signal 325 at the counter output terminal.

In certain examples, the counter unit 320 is coupled to the digital-to-analog conversion unit 330. In some examples, the counter unit 320 includes two counter input terminals and one counter output terminal. For example, the counter unit 320 is configured to receive an addition digital pulse signal at a first counter input terminal and receive a subtraction digital pulse signal at a second counter input terminal. As an example, the digital-to-analog conversion unit 330 is configured to generate the counter output signal 325 at the counter output terminal.

Figure 4:
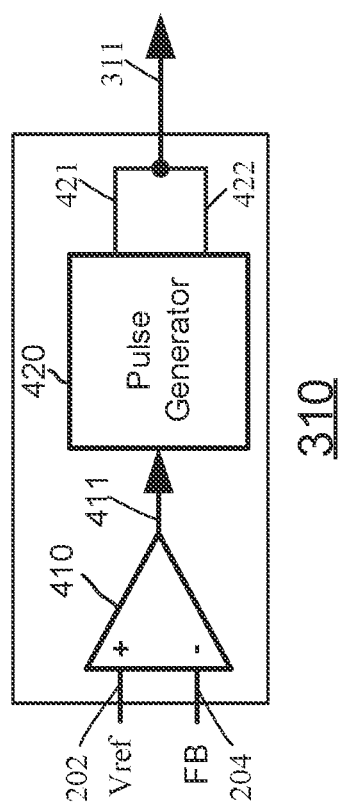
FIG. 4 is a simplified diagram showing certain components of the signal processing unit as part of the error amplification and processing unit as shown in FIG. 3 according to some embodiments of the present invention.

In some embodiments, the digital-to-analog conversion unit 330 is configured to receive the counter output signal 325 and generate the output signal 215 based at least in part on the counter output signal 325. In some examples, the output signal 215 is an analog output signal. In certain examples, the output signal 215 is a voltage signal. For example, the output signal 215 is an analog voltage signal. In some examples, the output signal 215 is the output signal of the error amplification and processing unit 210, as shown in FIG. 2 and FIG. 4. In certain examples, the digital-to-analog conversion unit 330 includes a conversion input terminal and a conversion output terminal. In certain examples, the digital-to-analog conversion unit 330 is configured to receive the counter output signal 325 at the conversion input terminal and generate the output signal 215 at the conversion output terminal. In some embodiments, the counter unit 320 is configured to generate the counter output signal 325 with a number of bits (e.g., 8 bits, 32 bits) corresponding to the same number of bits of the input of the digital-to-analog conversion unit 330.

As discussed above and further emphasized here, FIG. 3 is merely an example, which should not unduly limit the scope of the claims. One of ordinary skill in the art would recognize many variations, alternatives, and modifications. For example, the signal processing unit 310 is configured to generate a digital pulse signal. As an example, the signal processing unit 310 is configured to generate two digital pulse signals including one addition pulse signal and one subtraction pulse signal. For example, the signal processing unit 310 is configured to generate an addition pulse signal with pulses (e.g., digital pulses) when the feedback signal 204 is lower than the reference signal 202. As an example, the signal processing unit 310 is configured to generate a subtraction pulse signal with pulses (e.g., digital pulses) when the feedback signal 204 is higher than the reference signal 202. In some examples, the counter unit 320 is configured to receive a digital pulse signal and generate the counter output signal 325. In certain examples, the counter unit 320 is configured to receive two digital pulse signals and generate the counter output signal 325. For example, the counter unit 320 is configured to receive the addition pulse signal and perform addition counting, and further configured to receive the subtraction pulse signal and perform subtraction counting.

FIG. 4 is a simplified diagram showing certain components of the signal processing unit 310 as part of the error amplification and processing unit 210 as shown in FIG. 3 according to some embodiments of the present invention. This diagram is merely an example, which should not unduly limit the scope of the claims. One of ordinary skill in the art would recognize many variations, alternatives, and modifications. As shown in FIG. 4, the signal processing unit 310 includes an error amplifier 410 and a pulse generator 420. Although the above has been shown using a selected group of components for the signal processing unit 310, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

In some embodiments, the error amplifier 410 is configured to receive the reference signal 202 (e.g., Vref) and the feedback signal 204 (e.g., FB) and generate an amplification signal 411 based at least in part on the reference signal 202 and the feedback signal 204. In some examples, the error amplifier 410 includes two amplifier input terminals and one amplifier output terminal. In certain examples, the error amplifier 410 is configured to receive the reference signal 202 at a first amplifier input terminal and the feedback signal 204 at a second amplifier input terminal respectively. For example, the reference signal 202 is input to the first input terminal (e.g., the positive input terminal) of the error amplifier 410 and the feedback signal 204 is input to the second input terminal (e.g., the negative input terminal) of the error amplifier 410. As an example, the reference signal 202 is input to the first input terminal (e.g., the negative input terminal) of the error amplifier 410 and the feedback signal 204 is input to the second input terminal (e.g., the positive input terminal) of the error amplifier 410. In some examples, the error amplifier 410 is configured to generate the amplification signal 411 at the amplifier output terminal.

In certain examples, the error amplifier 410 includes a transconductance amplifier configured to convert a voltage difference of the input signals into a corresponding current signal. In some examples, the error amplifier 410 includes one or more other type(s) of amplifiers. In certain examples, the error amplifier 410 is coupled to the pulse generator 420. In some examples, the amplifier output terminal of the error amplifier 410 is coupled to the pulse generator 420.

In certain embodiments, the pulse generator 420 is configured to receive the amplification signal 411 and generate digital pulse signals 421 and 422 based at least in part on the amplification signal 411. In some examples, the pulse generator 420 includes a voltage-to-frequency conversion component. In certain examples, the pulse generator 420 includes a current-to-frequency conversion component. In some examples, the pulse generator 420 includes a voltage-to-frequency conversion component and a current-to-frequency conversion component. In certain examples, the pulse generator 420 includes a conversion input terminal and one or more conversion output terminals. In some examples, the pulse generator 420 is configured to receive the amplification signal 411 at the conversion input terminal.

In certain examples, the pulse generator 420 is configured to generate one or more digital pulse signals 311 at the one or more conversion output terminals. In some examples, the frequency of the digital pulse signal 311 is proportional to a magnitude of the amplification signal 411. For example, the frequency of the digital pulse signal 311 is higher when the magnitude of the amplification signal 411 is higher. As an example, the frequency of the digital pulse signal 311 is lower when the magnitude of the amplification signal 411 is lower. In certain examples, the digital pulse signal 311 includes an addition pulse signal 421 and a subtraction pulse signal 422. In some examples, the pulse generator 420 includes a conversion input terminal and two conversion output terminals. In certain examples, the pulse generator 420 is configured to receive the amplification signal 411 at the conversion input terminal and, based at least in part on a direction of the amplification signal 411, to generate the addition pulse signal 421 at a first conversion output terminal and the subtraction pulse signal 422 at a second conversion output terminal, where the second conversion output terminal is different from the first conversion output terminal.

In some examples, the direction of the amplification signal is positive when the amplification signal is flowing from the error amplifier 410 and the direction of the amplification signal is negative when the amplification signal is flowing to the error amplifier 410. For example, the pulse generator 420 is configured to generate the addition pulse signal 421 at the first conversion output terminal in response to the feedback signal 204 being lower than the reference signal 202 and the direction of the amplification signal 411 being positive (e.g., flowing from the error amplifier 410). As an example, the pulse generator 420 is configured to generate the subtraction pulse signal 422 at the second conversion output terminal in response to the feedback signal 204 being higher than the reference signal 202 and the direction of the amplification signal 411 being negative (e.g., flowing to the error amplifier 410).

In some examples, if the feedback signal 204 (e.g., FB) is higher than the reference signal 202 (e.g., Vref), which indicates the feedback signal 204 being too high and the system output (e.g., the system output signal of the signal and/or power conversion unit 250) to be reduced, the pulse generator 420 outputs the subtraction pulse signal 422 based at least in part on a difference between the feedback signal 204 and the reference signal 202. Referring back to FIG. 3, in some examples, the subtraction pulse signal 422 is input to the counter unit 320. In certain examples, the counter unit 320 is configured to perform subtraction counting based at least in part on the subtraction pulse signal 422. As an example, the larger of a difference between the feedback signal 204 and the reference signal 202, the amplification signal 411 being greater in magnitude, the frequency of the subtraction pulse signal 422 is higher.

In certain examples, if the feedback signal 204 (e.g., FB) is lower than the reference signal 202 (e.g., Vref), which indicates the feedback signal 204 being too low and the system output (e.g., the system output signal of the signal and/or power conversion unit 250) to be increased, the pulse generator 420 outputs the addition pulse signal 421 based at least in part on a difference between the feedback signal 204 and the reference signal 202. Referring back to FIG. 3, in some examples, the addition pulse signal 421 is input to the counter unit 320. In some cases, the counter unit 320 is configured to perform addition counting based at least in part on the addition pulse signal 421. As an example, the larger of a difference between the feedback signal 204 and the reference signal 202, the amplification signal 411 being greater in magnitude, the frequency of the addition pulse signal 421 is higher.

In some examples, the pulse generator 420 is configured to generate the addition pulse signal 421 with pulses (e.g., digital pulses) and the subtraction pulse signal 422 with pulses (e.g., digital pulses) one at a time, for example, based on a comparison of the feedback signal 204 and the reference signal 202. In certain examples, the pulse generator 420 is configured to generate the addition pulse signal 421 with pulses (e.g., digital pulses) and the subtraction pulse signal 422 with pulses (e.g., digital pulses) one at a time, for example, based on a direction of the amplification signal 411. In some examples, the addition pulse signal includes one or more pulses based at least in part on the direction of the amplification signal 411 (e.g., positive), the subtraction pulse signal includes one or more digital pulses based at least in part on the direction of the amplification signal 411 (e.g., negative).

As discussed above and further emphasized here, FIG. 4 is merely an example, which should not unduly limit the scope of the claims. One of ordinary skill in the art would recognize many variations, alternatives, and modifications. For example, the pulse generator 420 includes one circuit unit configured to generate the digital pulse signal 311. As an example, the pulse generator 420 includes one circuit unit configured to generate the addition pulse signal 421 and the subtraction pulse signal 422. For example, the pulse generator 420 includes two circuit units with a first circuit unit configured to generate the addition pulse signal 421 and a second circuit unit configured to generate the subtraction pulse signal 422.

Figure 5:
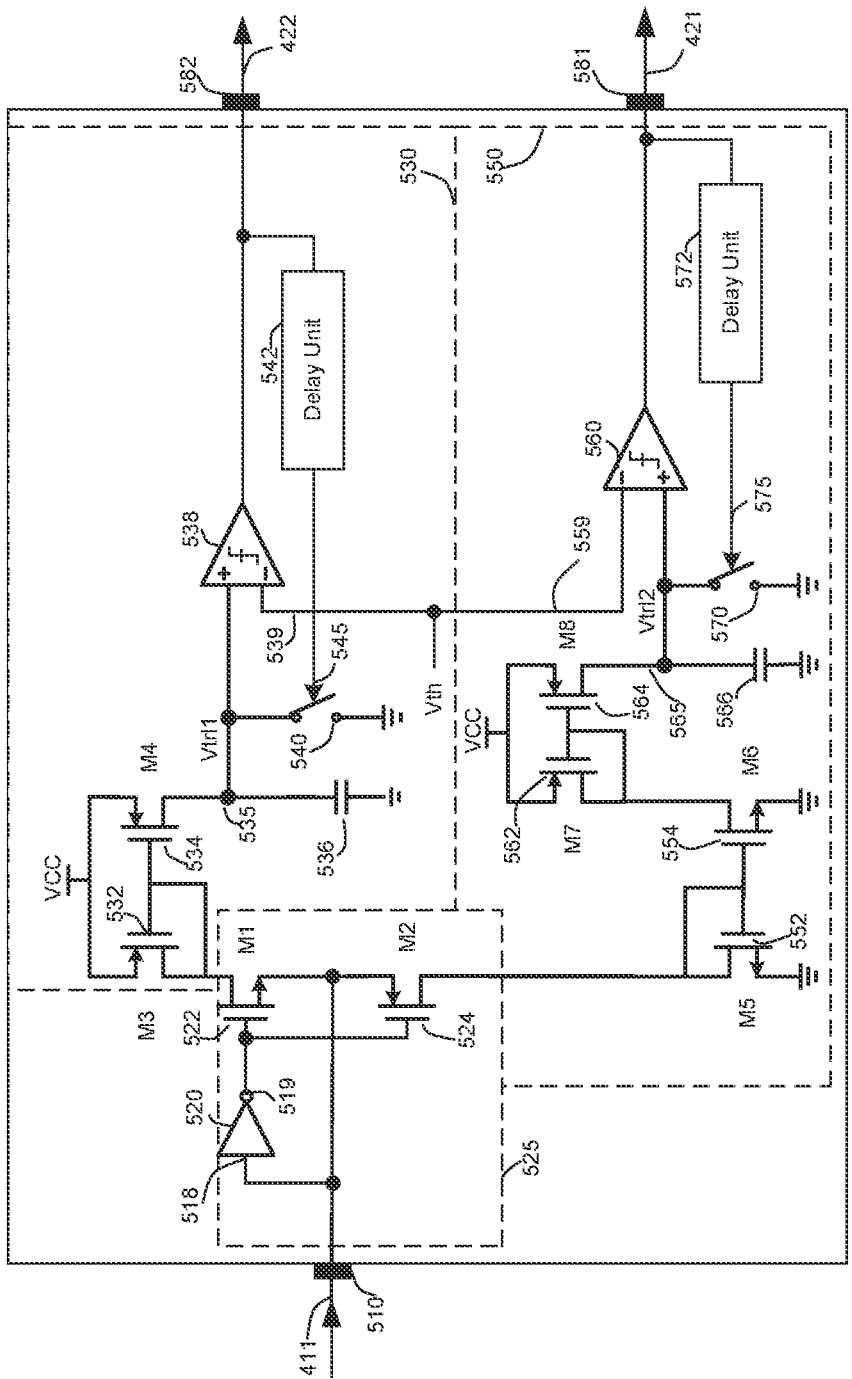
FIG. 5 is a simplified diagram showing certain components of the pulse generator as part of the signal processing unit shown in FIG. 4 according to certain embodiments of the present invention.

FIG. 5 is a simplified diagram showing certain components of the pulse generator 420 as part of the signal processing unit 310 shown in FIG. 4 according to certain embodiments of the present invention. This diagram is merely an example, which should not unduly limit the scope of the claims. One of ordinary skill in the art would recognize many variations, alternatives, and modifications. As shown in FIG. 5, the pulse generator 420 includes an inverter (e.g., a NOT gate) 520, a transistor 522 (e.g., M1), a transistor 524 (e.g., M2), a transistor 532 (e.g., M3), a transistor 534 (e.g., M4), a capacitor 536, a comparator 538, a switch 540, a delay unit 542, a transistor 552 (e.g., M5), a transistor 554 (e.g., M6), a comparator 560, a transistor 562 (e.g., M7), a transistor 564 (e.g., M8), a capacitor 566, a switch 570, and a delay unit 572. Although the above has been shown using a selected group of components for the pulse generator 420, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

In some embodiments, the pulse generator 420 includes an input terminal 510, a current direction switch 525, a subtraction pulse generator 530, an addition pulse generator 550, an addition output terminal 581, and a subtraction output terminal 582. In some examples, the current direction switch 525 includes the inverter 520 and the transistor pairs 522 and 524. In certain examples, the subtraction pulse generator 530 includes the transistor pairs 532 and 534, the capacitor 536, the comparator 538, the switch 540, and the delay unit 542. In some examples, the addition pulse generator 550 includes the transistor pairs 552 and 554, the comparator 560, the transistor pairs 562 and 564, the capacitor 566, the switch 570, and the delay unit 572. In certain examples, the pulse generator 420 is configured to receive the amplification signal 411 at the input terminal 510. In some examples, the pulse generator 420 is configured to output the addition pulse signal 421 at the addition output terminal 581 and output the subtraction pulse signal 422 at the subtraction output terminal 582.

In certain embodiments, the transistors 522, 524, 532, 534, 552, 554, 562, and 564 can be metal oxide semiconductor (MOS) transistors. For example, the transistors 522, 552, and 554 are N-type MOS transistors. As an example, the transistors 524, 532, 534, 562, and 564 are P-type MOS transistors.

In some embodiments, the comparators 538 and 560 can include voltage comparators. In certain examples, the capacitors C1 and C2 may have the same capacitance value. In certain examples, the inverter 520 includes an inverter input terminal 518 and an inverter output terminal 519. For example, the inverter input terminal 518 is configured to receive the amplification signal 411. As an example, the inverter input terminal 518 is connected to the input terminal 510. In some examples, the inverter input terminal 518 of the inverter 520 is connected to the source of the transistor 522 and the source of the transistor 524. In certain examples, the inverter output terminal 519 of the inverter 520 is connected to the gate of the transistor 522 and the gate of the transistor 524.

In certain embodiments, the inverter 520, the transistor 522, and the transistor 524 are connected to form the current direction switch 525. The current direction switch 525 is configured to receive the amplification signal 411 and generate a current switch output signal (e.g., the input signal to the current mirror 532 and 534, and/or the input signal to the current mirror 552 and 554) based at least in part on the amplification signal 411. Referring back to FIG. 4, the input terminal 510 of the pulse generator 420 is coupled to the output terminal of the error amplifier 410 to receive the amplification signal 411. In some examples, the error amplifier 410 is a transconductance amplifier and the amplification signal 411 is a current signal. In certain examples, the inverter 520 is configured to receive the amplification signal 411 and generate an inverter output based at least in part on the amplification signal 411.

In some embodiments, if the feedback signal 204 (e.g., FB) is higher than the reference signal 202 (e.g., Vref), the error amplifier 410 is configured to generate the amplification signal 411 as a sink current at the output terminal of the error amplifier 410. In some examples, the voltage at the input terminal 510 of the pulse generator 420 is relatively low in magnitude and lower than the threshold signal level (e.g., threshold voltage) of the inverter 520 and the output of the inverter 520 is at a logic high level, so that the transistor 522 (e.g., M1) is turned on and the transistor 524 (e.g., M2) is turned off. As an example, when the transistor 522 (e.g., M1) is turned on and the transistor 524 (e.g., M2) is turned off, the amplification signal 411 (e.g., a current signal) flows through the transistor 522 into the transistors 532 and 534 and charges the capacitor 536. In some examples, the transistors 532 and 534 form a current mirror.

In certain examples, a voltage 535 (e.g., Vtrl1) on the capacitor 536 is higher than the threshold voltage 539 (e.g., Vth) at the comparator 538, the comparator 538 outputs the subtraction pulse signal 422 at a logic high level. In some examples, the subtraction pulse signal 422 is coupled to the delay unit 542. In certain examples, the delay unit 542 is configured to generate a switch signal 545 at a logic high level after a delay when the subtraction pulse signal 422 is at a logic high level. For example, the switch 540 is turned on (e.g., the switch 540 is closed) when the switch signal 545 is at a logic high level. As an example, the switch 540 is turned off (e.g., the switch 540 is open) when the switch signal 545 is at a logic low level. For example, the capacitor 536 is discharged when the switch 540 is turned on (e.g., the switch 540 is closed), such that the voltage 535 (e.g., Vtrl1) is pulled down to 0 volt after a time period.

In some examples, the voltage 535 (e.g., Vtrl1) is lower than the threshold voltage 539 (e.g., Vth) at the comparator 538, the comparator 538 outputs the subtraction pulse signal 422 at a logic low level. In certain examples, if the feedback signal 204 (e.g., FB) continues to be lower than the reference signal 202 (e.g., Vref), the capacitor 536 is repeatedly charged and discharged. In some examples, when the feedback signal 204 (e.g., FB) continues to be lower than the reference signal 202 (e.g., Vref), the voltage 535 (e.g., Vtrl1) is repeatedly charged from 0V to the threshold voltage 539 (e.g., Vth) and then pulled down to 0V, the digital pulses of the subtraction pulse signal 422 are generated.

In certain embodiments, if the feedback signal 204 (e.g., FB) is lower than the reference signal 202 (e.g., Vref), the error amplifier 410 is configured to generate the amplification signal 411 as a source current at the output terminal of the error amplifier 410. In some examples, the voltage at the input terminal 510 of the pulse generator 420 is relatively high and higher than the threshold voltage (e.g., Vth1) of the inverter 520 and the output of the inverter 520 is at a logic low level, so that the transistor 522 (e.g., M1) is turned off and the transistor 524 (e.g., M2) is turned on. As an example, when the transistor 522 (e.g., M1) is turned off and the transistor 524 (e.g., M2) is turned on, the current 411 flows through the transistor 524 into the transistors 552, 554, 562, and 564 and charges the capacitor 566. In some examples, the transistors 552 and 554 form a current mirror. In certain examples, the transistors 562 and 564 form a current mirror.

In some examples, the voltage 565 (e.g., Vtrl2) on the capacitor 566 is higher than the threshold voltage 559 (e.g., Vth) at the comparator 560, the comparator 560 outputs the addition pulse signal 421 at a logic high level. In certain examples, the addition pulse signal 421 is coupled to the delay unit 572. In some examples, the delay unit 572 is configured to generate a switch signal 575 at a logic high level after a delay when the addition pulse signal 421 is at a logic high level. For example, the switch 570 is turned on (e.g., the switch 570 is closed) when the switch signal 575 is at a logic high level. As an example, the switch 570 is turned off (e.g., the switch 570 is open) when the switch signal 575 is at a logic low level. For example, the capacitor 566 is discharged when the switch 570 is turned on (e.g., the switch 570 is closed), such that the voltage 565 (e.g., Vtrl2) is pulled down to 0 volt after a time period.

In certain examples, the voltage 565 (e.g., Vtrl2) is lower than the threshold voltage 559 (e.g., Vth) at the comparator 560, the comparator 560 outputs the addition pulse signal 421 at a logic low level. In some examples, if the feedback signal 204 (e.g., FB) continues to be higher than the reference signal 202 (e.g., Vref), the capacitor 566 is repeatedly charged and discharged. In certain examples, when the feedback signal 204 (e.g., FB) continues to be higher than the reference signal 202 (e.g., Vref), the voltage 565 (e.g., Vtrl2) is repeatedly charged from 0V to the threshold voltage 559 (e.g., Vth) and then pulled down to 0V, the digital pulses of addition pulse signal 421 are generated. For example, the threshold voltage 539 and the threshold voltage 559 is at a same voltage level (e.g., Vth) as each other. As an example, the threshold voltage 539 and the threshold voltage 559 is at a different voltage level from each other.

In some embodiments, referring to FIG. 4, the error amplifier 410 is configured to generate the amplification signal 411 based at least in part on the difference (e.g., the different in magnitude, voltage difference, etc.) between the feedback signal 204 (e.g., FB) and the reference signal 202 (e.g., Vref). In some examples, the greater the difference between the feedback signal 204 (e.g., FB) and the reference signal 202 (e.g., Vref), the greater is the amplification signal 411 in magnitude, and the charging current to the capacitor 536 and/or 566 is larger, such that the voltage 535 on the capacitor 536 and/or the voltage 565 on the capacitor 566 changes faster and the frequency of the addition pulse signal 421 and/or the frequency of the subtraction pulse signal 422 is higher.

In certain embodiments, the capacitor 536 and/or the capacitor 566 has a relatively small capacitance value (e.g., 5 picofarads, 100 picofarads) such that the capacitor 536 and/or the capacitor 566 can be incorporated into an integrated circuit. In some examples, referring back to FIGS. 2 and 3, the modulation control system 200 has an equivalent capacitance value related to the capacitor 536 and/or the capacitor 566. In certain examples, the modulation control system has an equivalent capacitance value related to the number of bits of the counter unit 320 and/or the number of bits of the digital-to-analog conversion unit 330. For example, the modulation control system 200 has an equivalent capacitance value proportional to the capacitance value of the capacitor 536 and/or the capacitor 566. As an example, the modulation control system 200 has an equivalent capacitance value proportional to the capacitance value of the capacitor 536 and/or the capacitor 566 and $2^n$, where n is the number of bits of the counter unit 320 and/or the number of bits of the digital-to-analog converter 330. For example, the modulation control system 200 has an equivalent capacitance value proportional to the capacitance value of the capacitor 536 and/or the capacitor 566 multiplied by $2^n$, where n is the number of bits of the counter unit 320 and/or the number of bits of the digital-to-analog conversion unit 330.

In some embodiments, the modulation control system 200 has a relatively large equivalent capacitance value using capacitor(s) (e.g., the capacitor 536, the capacitor 566) with relatively small capacitance value(s). For example, the modulation control system 200 can be realized without the need to set up additional capacitors external to an integrated chip (IC), which can reduce the number of peripheral components in the modulation control system 200, the physical size of the modulation control system 200, and/or reduce the manufacturing cost. As an example, certain or all components of the modulation control system 200 integrated into a single integrated circuit chip can prevent the certain components from being influenced by operation environments and can extend the life of the control system.

As discussed above and further emphasized here, FIG. 5 is merely an example, which should not unduly limit the scope of the claims. One of ordinary skill in the art would recognize many variations, alternatives, and modifications. For example, the current direction switch 525 can be implemented using an alternative circuit design. As an example, the addition pulse generator 550 can be combined with the subtraction pulse generator 530. For example, the addition pulse generator 550 and/or the subtraction pulse generator 530 may be implemented using less transistors. As an example, the current mirror (e.g., transistors 532 and 534, transistors 552 and 554, transistors 562 and 564) can be replaced by other signal processing components. For example, the subtraction pulse generator 530 and/or the addition pulse generator 550 can be implemented with additional signal processing components.

Figure 6:
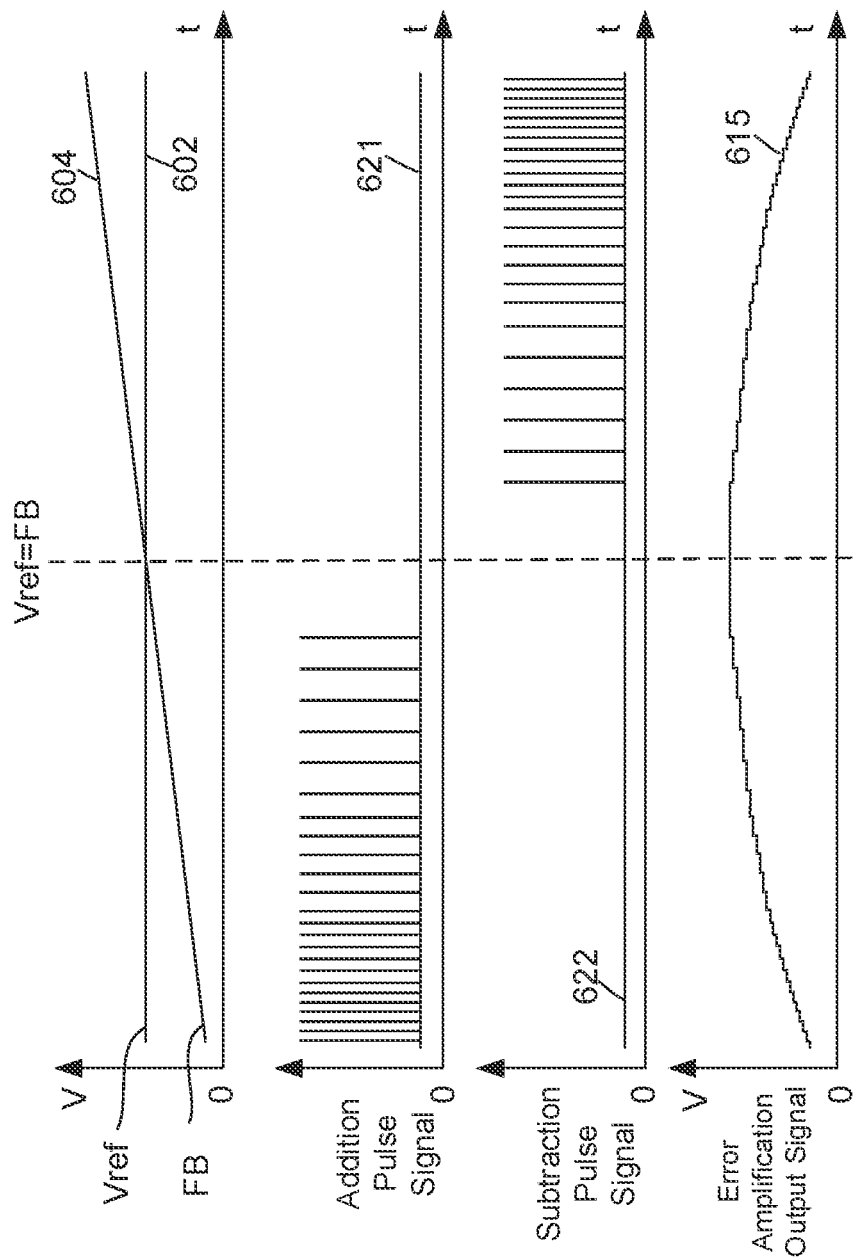
FIG. 6 shows simplified timing diagrams of a modulation control system according to some embodiments of the present invention.

FIG. 6 shows simplified timing diagrams of a modulation control system according to some embodiments of the present invention. These diagrams are merely examples, which should not unduly limit the scope of the claims. One of ordinary skill in the art would recognize many variations, alternatives, and modifications. As shown in FIG. 6, the waveform 602 represents the reference signal 202 (e.g., Vref) as a function of time, the waveform 604 represents the feedback signal 204 (e.g., FB) as a function of time, the waveform 621 represents the addition pulse signal 421 as a function of time, the waveform 622 represents the subtraction pulse signal 422 as a function of time, and the waveform 615 represents the output signal 215 from the error amplification and processing unit 210 as a function of time.

As shown by the waveforms 602, 604, and 621, when the feedback signal 204 (e.g., FB) is lower than the reference signal 202 (e.g., Vref) in magnitude, the addition pulse signal 421 includes one or more digital pulses, and the pulse frequency of the addition pulse signal 421 changes with the difference (e.g., a difference in magnitude, a voltage difference, etc.) between the feedback signal 204 (e.g., FB) and the reference signal 202 (e.g., Vref). In some examples, when the feedback signal 204 (e.g., FB) is lower than the reference signal 202 (e.g., Vref) in magnitude, the greater the difference (e.g., a difference in magnitude, a voltage difference, etc.) between the feedback signal 204 (e.g., FB) and the reference signal (e.g., Vref), the higher the frequency of the addition pulse signal 421. In certain examples, when the feedback signal 204 (e.g., FB) is lower than the reference signal 202 (e.g., Vref) in magnitude, the smaller the difference (e.g., a difference in magnitude, a voltage difference, etc.) between the feedback signal 204 (e.g., FB) and the reference signal (e.g., Vref), the lower the frequency of the addition pulse signal 421.

Referring back to FIG. 2 and FIG. 3, in some examples, the addition pulse signal 421, which is included in the digital pulse signal 311, is processed by the counter unit 320 and the digital-to-analog conversion unit 330 to generate the output signal 215 of the error amplification and processing unit 210. As shown by the waveforms 602, 604, 621, and 615, in certain examples, the output signal 215 gradually increases in magnitude as the frequency of the addition pulse signal 421 decreases. For example, when the feedback signal 204 (e.g., FB) is lower than the reference signal 202 (e.g., Vref) in magnitude, as the difference (e.g., a difference in magnitude, a voltage difference, etc.) between the feedback signal 204 (e.g., FB) and the reference signal (e.g., Vref) decreases, the output signal 215 of the error amplification and processing unit 210 increases in magnitude. As an example, when the feedback signal 204 (e.g., FB) and the reference signal (e.g., Vref) are equal in magnitude, the output signal 215 reaches its maximum magnitude. For example, when the feedback signal 204 (e.g., FB) is lower than the reference signal (e.g., Vref) in magnitude, the subtraction pulse signal 422 does not include any digital pulses.

As shown by the waveforms 602, 604, and 622, when the feedback signal 204 (e.g., FB) is higher than the reference signal 202 (e.g., Vref) in magnitude, the subtraction pulse signal 422 includes one or more digital pulses, and the frequency of the subtraction pulse signal 422 changes with the difference (e.g., a difference in magnitude, a voltage difference, etc.) between the feedback signal 204 (e.g., FB) and the reference signal (e.g., Vref). In some examples, when the feedback signal 204 (e.g., FB) is higher than the reference signal 202 (e.g., Vref) in magnitude, the greater the difference (e.g., a difference in magnitude, a voltage difference, etc.) between the feedback signal 204 (e.g., FB) and the reference signal (e.g., Vref), the higher the frequency of the subtraction pulse signal 422. In certain examples, when the feedback signal 204 (e.g., FB) is higher than the reference signal 202 (e.g., Vref) in magnitude, the smaller the difference (e.g., a difference in magnitude, a voltage difference, etc.) between the feedback signal 204 (e.g., FB) and the reference signal (e.g., Vref), the lower the frequency of the subtraction pulse signal 422.

Referring back to FIG. 2 and FIG. 3, in some examples, the subtraction pulse signal 422, which is included in the digital pulse signal 311, is processed by the counter unit 320 and the digital-to-analog conversion unit 330 to generate the output signal 215 of the error amplification and processing unit 210. As shown by the waveforms 602, 604, 622, and 615, in certain examples, the output signal 215 gradually decreases in magnitude as the frequency of the subtraction pulse signal 422 increases. For example, when the feedback signal 204 (e.g., FB) is higher than the reference signal 202 (e.g., Vref) in magnitude, as the difference (e.g., a difference in magnitude, a voltage difference, etc.) between the feedback signal 204 (e.g., FB) and the reference signal (e.g., Vref) increases, the output signal 215 of the error amplification and processing unit 210 decreases in magnitude. As an example, when the feedback signal 204 (e.g., FB) and the reference signal (e.g., Vref) are equal in magnitude, the output signal 215 is at its maximum magnitude. For example, when the feedback signal 204 (e.g., FB) is higher than the reference signal (e.g., Vref) in magnitude, the addition pulse signal 421 does not include any digital pulses.

Figure 7:
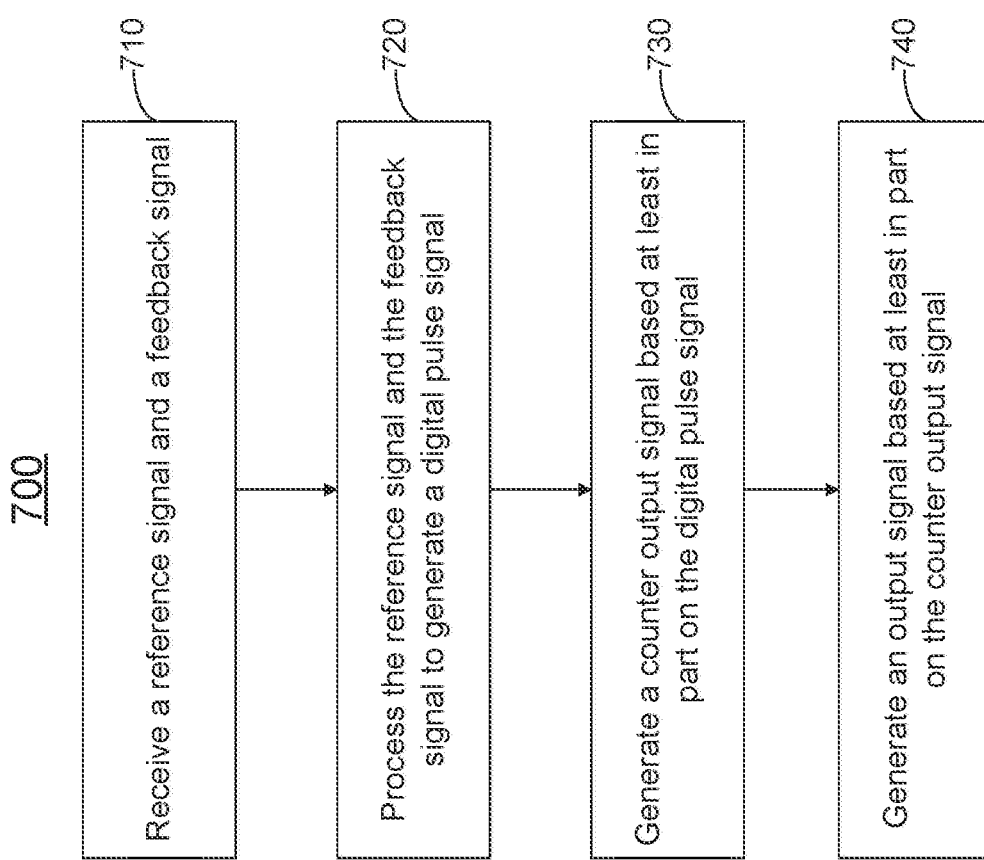
FIG. 7 is a simplified diagram showing a method for the modulation control system as shown in FIG. 2 and FIG. 3 according to certain embodiments of the present invention.

FIG. 7 is a simplified diagram showing a method for the modulation control system 200 as shown in FIG. 2 and FIG. 3 according to certain embodiments of the present invention. This diagram is merely an example, which should not unduly limit the scope of the claims. One of ordinary skill in the art would recognize many variations, alternatives, and modifications. The method 700 includes a process 710 for receiving the reference signal 202 (e.g., Vref) and the feedback signal 204 (e.g., FB), a process 720 for processing the reference signal 202 (e.g., Vref) and the feedback signal 204 (e.g., FB) and generating the digital pulse signal 311, a process 730 for generating the counter output signal 325 based at least in part on the digital pulse signal 311, and a process 740 for generating the output signal 215 based at least in part on the counter output signal 325.

At the process 710, the modulation control system 200 is configured to receive the reference signal 202 (e.g., Vref) and the feedback signal 204 (e.g., FB) according to certain embodiments. At the process 720, the modulation control system 200 is configured to process the reference signal 202 (e.g., Vref) and the feedback signal 204 (e.g., FB) to generate the digital pulse signal 311 according to some embodiments. In some examples, the processing the reference signal and the feedback signal includes using an error amplifier (e.g., the error amplifier 410) to receive the reference signal and the feedback signal and generate an amplification signal (e.g., the amplification signal 411), and using a pulse generator (e.g., the pulse generator 420) to receive the amplification signal and generate a digital pulse signal (e.g., the digital pulse signal 311). In certain examples, based at least in part the direction of the amplification signal (e.g., positive or negative), the digital pulse signal may include an addition pulse signal (e.g., the addition pulse signal 421) having pulses or a subtraction pulse signal (e.g., the subtraction pulse signal 422) having pulses.

In some examples, when the feedback signal 204 is lower than the reference signal 202, the amplification signal 411 is positive and the digital pulse signal 311 includes the addition pulse signal 421 including one or more digital pulses. In certain examples, when the feedback signal 204 is higher than the reference signal 202, the amplification signal 411 is negative and the digital pulse signal 311 includes the subtraction pulse signal 422 including one or more digital pulses.

At the process 730, the modulation control system 200 is configured to generate a counter output signal (e.g., the counter output signal 325) based at least in part on the digital pulse signal 311. In some examples, generating the counter output signal includes performing addition counting based at least in part on the addition pulse signal (e.g., the addition pulse signal 421), and/or performing subtraction counting based on the subtraction pulse signal (e.g., the subtraction pulse signal 422) and generating the counter output signal based at least in part on the addition counting and/or the subtraction counting.

At the process 740, the modulation control system 200 is configured to generate an output signal (e.g., the output signal 215) based at least in part on the counter output signal 325. In certain examples, the generating the output signal includes generating the output signal using a digital-to-analog converter (e.g., the digital-to-analog conversion unit 330). For example, the output signal is an analog output signal. In some examples, the output signal is provided to a modulation control unit (e.g., the modulation control unit 230) as an input to the modulation control unit.

Figure 8:
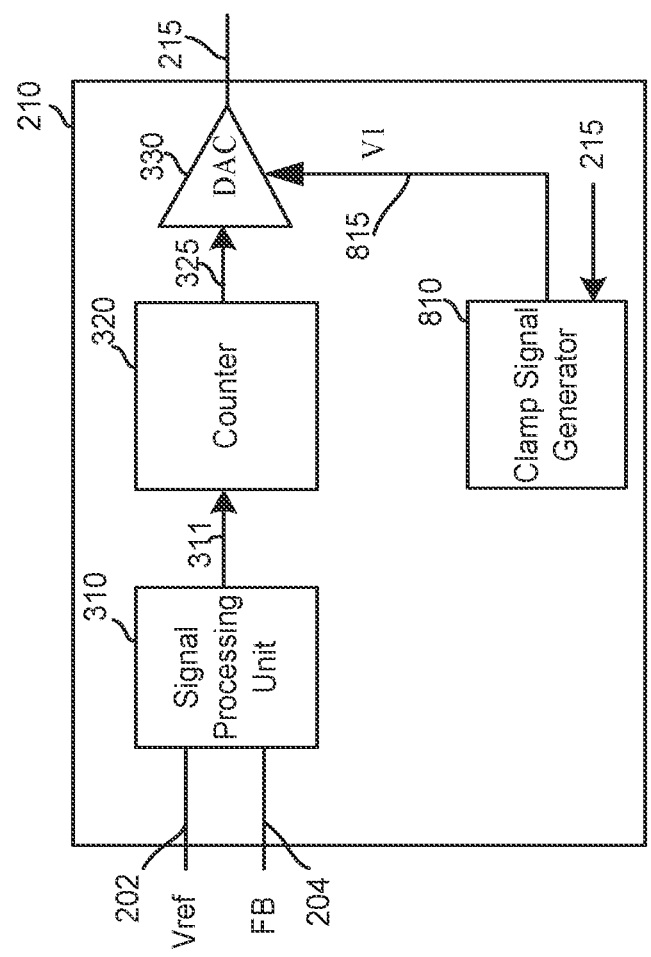
FIG. 8 is a simplified diagram showing certain components of the error amplification and processing unit as part of the modulation control system as shown FIG. 2 according to some embodiments of the present invention.

FIG. 8 is a simplified diagram showing certain components of the error amplification and processing unit 210 as part of the modulation control system 200 as shown FIG. 2 according to some embodiments of the present invention. This diagram is merely an example, which should not unduly limit the scope of the claims. One of ordinary skill in the art would recognize many variations, alternatives, and modifications. As shown in FIG. 8, the error amplification and processing unit 210 includes a signal processing unit 310, a counter unit 320, a digital-to-analog conversion (DAC) unit 330, and a clamp signal generator 810. Although the above has been shown using a selected group of components for the error amplification and processing unit 210, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

In some embodiments, the signal processing unit 310 is configured to receive a reference signal 202 (e.g., Vref) and a feedback signal 204 (e.g., FB) and generate a digital pulse signal 311 based at least in part on the reference signal 202 and the feedback signal 204. In one embodiment, the signal processing unit 310 includes two input terminals and an output terminal. For example, the two input terminals of the signal processing unit 310 are configured to receive the reference signal 202 and the feedback signal 204 respectively. As an example, the output terminal of the signal processing unit 310 is configured to output the digital pulse signal 311. In some examples, the signal processing unit 310 is configured to process the reference signal 202 and the feedback signal 204 and perform an analog-to-digital conversion.

In some examples, the digital pulse signal 311 is associated with a difference between the reference signal 202 and the feedback signal 204. In certain examples, the digital pulse signal 311 is associated with a difference in magnitude between the reference signal 202 and the feedback signal 204. In some examples, the digital pulse signal 311 is associated with a voltage difference between the reference signal 202 and the feedback signal 204. In certain examples, the digital pulse signal 311 has a frequency based at least in part on a difference between the reference signal 202 and the feedback signal 204. In some examples, the signal processing unit 310 is configured to process information associated with the reference signal 202 and the feedback signal 204 to generate the digital pulse signal 311. In certain examples, the output terminal of the signal processing unit 310 is coupled to the counter unit 320.

In certain embodiments, the counter unit 320 is configured to receive the digital pulse signal 311 and generate the counter output signal 325 based at least in part on the digital pulse signal 311. In some examples, the counter unit 320 is configured to perform addition counting (e.g., for the addition pulse signal 421) and/or subtraction counting (e.g., for the subtraction pulse signal 422) based on the digital pulse signal 311 and generate the counter output signal 325. In certain examples, the counter output signal 325 is a digital signal. In some examples, the counter unit 320 includes a counter input terminal and a counter output terminal. For example, the counter unit 320 is configured to receive the digital pulse signal 311 at the counter input terminal. As an example, the counter unit 320 is configured to generate the counter output signal 325 at the counter output terminal.

In some examples, counter unit 320 is coupled to the digital-to-analog conversion unit 330. In certain examples, the output terminal of the counter unit 320 is coupled to the digital-to-analog conversion unit 330. In some examples, the counter unit 320 includes two counter input terminals and one counter output terminal. For example, the counter unit 320 is configured to receive an addition digital pulse signal at a first counter input terminal and receive a subtraction digital pulse signal at a second counter input terminal. As an example, the digital-to-analog conversion unit 330 is configured to generate the counter output signal 325 at the one counter output terminal.

In some embodiments, the digital-to-analog conversion unit 330 is configured to receive the counter output signal 325 and generate the output signal 215 based at least in part on the counter output signal 325. In some examples, the output signal 215 is an analog output signal. In certain examples, the output signal 215 is a voltage signal. For example, the output signal 215 is an analog voltage signal. In one example, the output signal 215 is the output signal of the error amplification and processing unit 210 in FIG. 2. In some examples, the digital-to-analog conversion unit 330 includes a conversion input terminal and a conversion output terminal. In certain examples, the digital-to-analog conversion unit 330 is configured to receive the counter output signal 325 at the conversion input terminal and generate the output signal 215 at the conversion output terminal. In some embodiments, the counter unit 320 is configured to generate the counter output signal 325 with a number of bits (e.g., 8 bits, 32 bits) corresponding to a same number of bits of the input of the digital-to-analog conversion unit 330.

In certain embodiments, the clamp signal generator 810 is configured to receive the output signal 215 and generate a clamp signal 815 (e.g., V1) based at least in part on the output signal 215. In some examples, the clamp signal 815 is coupled to the digital-to-analog conversion unit 330. In certain examples, the digital-to-analog conversion unit 330 is configured to receive the clamp signal 815 and generate the output signal 215 based at least in part on the clamp signal 815. In some examples, the clamp signal 815 is a clamp voltage. In certain examples, the clamp signal 815 is coupled to the digital-to-analog conversion unit 330 and used to limit the magnitude of the output signal 215 to an upper limit and/or a lower limit. For example, if the output signal 215 is greater than the threshold signal (e.g., the clamp signal 815) in magnitude, the output signal 215 is set to the threshold signal (e.g., the clamp signal 815) in magnitude. As an example, if the output signal 215 is lower than the threshold signal (e.g., the clamp signal 815) in magnitude, the output signal 215 is set to the threshold signal (e.g., the clamp signal 815) in magnitude.

In some embodiments, the clamp signal generator 810 is configured to monitor and/or detect the output signal 215 of the digital-to-analog conversion unit 330 and generate the clamp signal 815 (e.g., V1) based at least in part on the output signal 215. In some examples, the clamp signal generator 810 is configured to generate an upper clamp signal if the output signal 215 is greater than an upper threshold signal (e.g., an upper threshold voltage) in magnitude. For example, the upper clamp signal can be used to prevent the output signal 215 from further increment. In certain examples, the clamp signal generator 810 is configured to generate a lower clamp signal if the output signal 215 is lower than a lower threshold signal (e.g., a lower threshold voltage) in magnitude. For example, the lower clamp signal can be used to prevent the output signal 215 from further decrement.

In some examples, the clamp signal generator 810 is configured to generate the clamp signal 815 (e.g., V1) in response to the output signal 215 being greater than an upper threshold signal (e.g., an upper threshold voltage) or lower than a lower threshold signal (e.g., a lower threshold voltage). For example, the digital-to-analog conversion unit 330 is configured to use the clamp signal 815 to prevent the output signal 215 from further increment and/or further decrement.

As discussed above and further emphasized here, FIG. 8 is merely an example, which should not unduly limit the scope of the claims. One of ordinary skill in the art would recognize many variations, alternatives, and modifications. For example, the signal processing unit 310 is configured to generate a digital pulse signal. As an example, the signal processing unit 310 is configured to generate two digital pulse signals with one addition digital pulse signal and one subtraction digital pulse signal. For example, the signal processing unit 310 is configured to generate an addition digital pulse signal when the feedback signal 204 is lower than the reference signal 202. As an example, the signal processing unit 310 is configured to generate a subtraction digital pulse signal when the feedback signal 204 is higher than the reference signal 202. For example, the counter unit 320 is configured to receive a digital pulse signal and generate the counter output signal 325. As an example, the counter unit 320 is configured to receive two digital pulse signals and generate the counter output signal 325. For example, the counter unit 320 is configured to receive the addition digital pulse signal and perform addition counting, and receive the subtraction digital pulse signal and perform subtraction counting.

Figure 9:
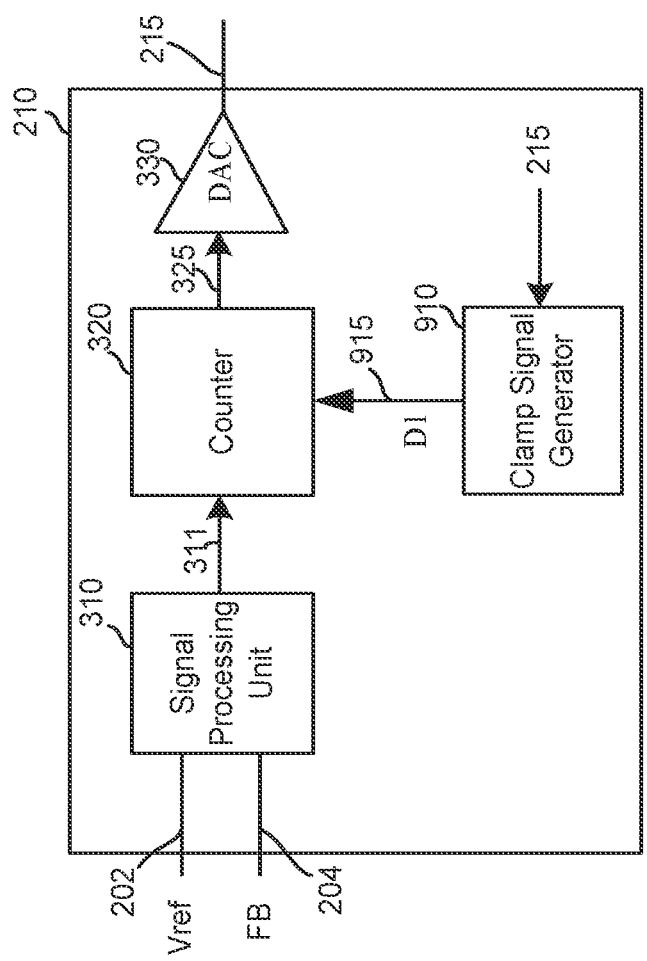
FIG. 9 is a simplified diagram showing certain components of the error amplification and processing unit as part of the modulation control system as shown FIG. 2 according to certain embodiments of the present invention.

FIG. 9 is a simplified diagram showing certain components of the error amplification and processing unit 210 as part of the modulation control system 200 as shown FIG. 2 according to certain embodiments of the present invention. This diagram is merely an example, which should not unduly limit the scope of the claims. One of ordinary skill in the art would recognize many variations, alternatives, and modifications. As shown in FIG. 9, the error amplification and processing unit 210 includes a signal processing unit 310, a counter unit 320, a digital-to-analog conversion (DAC) unit 330, and a clamp signal generator 910. Although the above has been shown using a selected group of components for the error amplification and processing unit 210, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

In some embodiments, the signal processing unit 310 is configured to receive a reference signal 202 (e.g., $V_{ref}$) and a feedback signal 204 (e.g., FB) and generate a digital pulse signal 311 based at least in part on the reference signal 202 and the feedback signal 204. In one embodiment, the signal processing unit 310 includes two input terminals and an output terminal. For example, the two input terminals of the signal processing unit 310 are configured to receive the reference signal 202 and the feedback signal 204 respectively. As an example, the output terminal of the signal processing unit 310 is configured to output the digital pulse signal 311. In some examples, the signal processing unit 310 is configured to process the reference signal 202 and the feedback signal 204 and perform an analog-to-digital conversion.

In some examples, the digital pulse signal 311 is associated with a difference between the reference signal 202 and the feedback signal 204. In certain examples, the digital pulse signal 311 is associated with a difference in magnitude between the reference signal 202 and the feedback signal 204. In some examples, the digital pulse signal 311 is associated with a voltage difference between the reference signal 202 and the feedback signal 204. In certain examples, the digital pulse signal 311 has a frequency based at least in part on a difference between the reference signal 202 and the feedback signal 204. In some examples, the signal processing unit 310 is configured to process information associated with the reference signal 202 and the feedback signal 204 to generate the digital pulse signal 311. In certain examples, the output terminal of the signal processing unit 310 is coupled to the counter unit 320.

In certain embodiments, the counter unit 320 is configured to receive the digital pulse signal 311 and generate the counter output signal 325 based at least in part on the digital pulse signal 311. In some examples, the counter unit 320 is configured to perform addition counting (e.g., for the addition pulse signal 421) and/or subtraction counting (e.g., for the addition pulse signal 422) based on the digital pulse signal 311 and generate the counter output signal 325. In certain examples, the counter output signal 325 is a digital signal. In some examples, the counter unit 320 includes a counter input terminal and a counter output terminal. For example, the counter unit 320 is configured to receive the digital pulse signal 311 at the counter input terminal. As an example, the counter unit 320 is configured to generate the counter output signal 325 at the counter output terminal.

In some examples, the counter unit 320 is coupled to the digital-to-analog conversion unit 330. In certain examples, the output terminal of the counter unit 320 is coupled to the digital-to-analog conversion unit 330. In some examples, the counter unit 320 includes two counter input terminals and one counter output terminal. For example, the counter unit 320 is configured to receive an addition digital pulse signal at a first counter input terminal and receive a subtraction digital pulse signal at a second counter input terminal. As an example, the digital-to-analog conversion unit 330 is configured to generate the counter output signal 325 at the one counter output terminal.

In some embodiments, the digital-to-analog conversion unit 330 is configured to receive the counter output signal 325 and generate the output signal 215 based at least in part on the counter output signal 325. In some examples, the output signal 215 is an analog output signal. In certain examples, the output signal 215 is a voltage signal. For example, the output signal 215 is an analog voltage signal. In one example, the output signal 215 is the output signal of the error amplification and processing unit 210 in FIG. 2. In some examples, the digital-to-analog conversion unit 330 includes a conversion input terminal and a conversion output terminal. In certain examples, the digital-to-analog conversion unit 330 is configured to receive the counter output signal 325 at the conversion input terminal and generate the output signal 215 at the conversion output terminal. In some embodiments, the counter unit 320 is configured to generate the counter output signal 325 with a number of bits (e.g., 8 bits, 32 bits) corresponding to a same number of bits of the input of the digital-to-analog conversion unit 330.

In certain embodiments, the clamp signal generator 910 is configured to receive the output signal 215 and generate a clamp signal 915 (e.g., D1) based at least in part on the output signal 215. In some examples, the clamp signal 915 is coupled to the counter unit 320. In certain examples, the counter unit 320 is configured to receive the clamp signal 915 and generate the counter output signal 325 based at least in part on the clamp signal 915. In some examples, the clamp signal 915 is a digital clamp signal. In certain examples, the clamp signal 915 is coupled to the counter unit 320 to control the counter output signal 325, and further used to limit the magnitude the output signal 215 of the digital-to-analog conversion unit 330 to an upper limit and/or a lower limit. For example, if the output signal 215 is greater than an upper threshold level, the clamp signal generator 910 is configured to generate the clamp signal 915 (e.g., D1), to limit the output signal from further increment. As an example, if the output signal 215 is lower than a lower threshold level, the clamp signal generator 910 is configured to generate the clamp signal 915 (e.g., D1), to limit the output signal from further decrement.

In some embodiments, the clamp signal generator 910 is configured to monitor and/or detect the output signal 215 of the digital-to-analog conversion unit 330 and generate the clamp signal 915 (e.g., D1) based at least in part on the output signal 215. In some examples, the clamp signal generator 910 is configured to generate an upper clamp signal if the output signal 215 is greater than an upper threshold signal (e.g., an upper threshold voltage) in magnitude. For example, the upper clamp signal can be used to limit the counter output signal 325 and prevent the output signal 215 from further increment. In certain examples, the clamp signal generator 910 is configured to generate a lower clamp signal if the output signal 215 is lower than a lower threshold signal (e.g., a lower threshold voltage) in magnitude. For example, the lower clamp signal can be used to limit the counter output signal 325 and prevent the output signal 215 from further decrement.

In some examples, the clamp signal generator 910 is configured to generate the clamp signal 915 (e.g., D1) in response to the output signal 215 is greater than an upper threshold signal (e.g., an upper threshold voltage) or lower than a lower threshold signal (e.g., a lower threshold voltage). For example, the counter unit 320 is configured to use the clamp signal 915 to control the counter output signal 325 and further prevent the output signal 215 from further increment and/or further decrement.

As discussed above and further emphasized here, FIG. 9 is merely an example, which should not unduly limit the scope of the claims. One of ordinary skill in the art would recognize many variations, alternatives, and modifications. For example, the signal processing unit 310 is configured to generate a digital pulse signal. As an example, the signal processing unit 310 is configured to generate two digital pulse signals with one addition digital pulse signal and one subtraction digital pulse signal. For example, the signal processing unit 310 is configured to generate an addition digital pulse signal when the feedback signal 204 is lower than the reference signal 202. As an example, the signal processing unit 310 is configured to generate a subtraction digital pulse signal when the feedback signal 204 is higher than the reference signal 202. For example, the counter unit 320 is configured to receive a digital pulse signal and generate the counter output signal 325. As an example, the counter unit 320 is configured to receive two digital pulse signals and generate the counter output signal 325. For example, the counter unit 320 is configured to receive the addition digital pulse signal and perform addition counting, and receive the subtraction digital pulse signal and perform subtraction counting.

Figure 10:
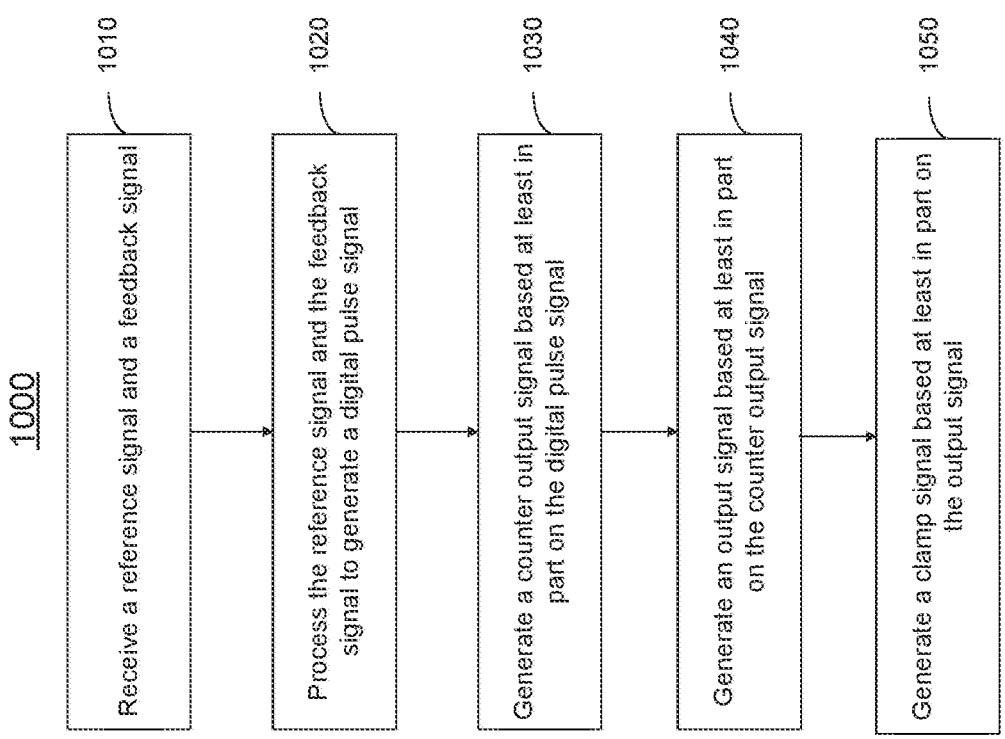
FIG. 10 is a simplified diagram showing a method for the modulation control system 200 as shown FIG. 2, FIG. 8, and FIG. 9 according to certain embodiments of the present invention.

FIG. 10 is a simplified diagram showing a method for the modulation control system 200 as shown in FIG. 2, FIG. 8, and FIG. 9 according to certain embodiments of the present invention. This diagram is merely an example, which should not unduly limit the scope of the claims. One of ordinary skill in the art would recognize many variations, alternatives, and modifications. The method 1000 includes a process 1010 for receiving the reference signal 202 (e.g., Vref) and the feedback signal 204 (e.g., FB), a process 1020 for processing the reference signal 202 (e.g., Vref) and the feedback signal 204 (e.g., FB) and generating the digital pulse signal 311, a process 1030 for generating the counter output signal 325 based at least in part on the digital pulse signal 311, a process 1040 for generating the output signal 215 based at least in part on the counter output signal 325, and a process 1050 for generating the clamp signal (e.g., the clamp signal 815, the clamp signal 915) based at least in part on the output signal 215.

At the process 1010, the modulation control system 200 is configured to receive the reference signal 202 (e.g., Vref) and the feedback signal 204 (e.g., FB) according to certain embodiments. At the process 1020, the modulation control system 200 is configured to process the reference signal 202 (e.g., Vref) and the feedback signal 204 (e.g., FB) to generate the digital pulse signal 311 according to some embodiments. In some examples, the processing the reference signal and the feedback signal includes using an error amplifier (e.g., the error amplifier 410) to receive the reference signal and the feedback signal and generate an amplification signal (e.g., the amplification signal 411), and using a pulse generator (e.g., the pulse generator 420) to receive the amplification signal and generate a digital pulse signal (e.g., the digital pulse signal 311). In certain examples, based at least in part the direction of the amplification signal (e.g., positive or negative), the digital pulse signal may include an addition pulse signal (e.g., the addition pulse signal 421) having pulses or a subtraction pulse signal (e.g., the subtraction pulse signal 422) having pulses.

In some examples, when the feedback signal 204 is lower than the reference signal 202, the amplification signal 411 is positive and the digital pulse signal 311 includes the addition pulse signal 421 including one or more digital pulses. In certain examples, when the feedback signal 204 is higher than the reference signal 202, the amplification signal 411 is negative and the digital pulse signal 311 includes the subtraction pulse signal 422 including one or more digital pulses.

At the process 1030, the modulation control system 200 is configured to generate a counter output signal (e.g., the counter output signal 325) based at least in part on the digital pulse signal 311. In some examples, generating the counter output signal includes performing addition counting based at least in part on the addition pulse signal (e.g., the addition pulse signal 421), and/or performing subtraction counting based on the subtraction pulse signal (e.g., the subtraction pulse signal 422) and generating the counter output signal based at least in part on the addition counting and/or the subtraction counting.

At the process 1040, the modulation control system 200 is configured to generate an output signal (e.g., the output signal 215) based at least in part on the counter output signal 325. In certain examples, the generating the output signal includes generating the output signal using a digital-to-analog converter (e.g., the digital-to-analog conversion unit 330). For example, the output signal is an analog output signal. In some examples, the output signal is provided to a modulation control unit (e.g., the modulation control unit 230) as an input to the modulation control unit.

At the process 1050, the modulation control is configured to generate a clamp signal (e.g., the clamp signal 815, the clamp signal 915) based at least in part on the output signal 215. In some examples, the generating the clamp signal includes generating the clamp signal using a clamp signal generator (e.g., the clamp signal generator 810, the clamp signal generator 910). For example, the clamp signal is a voltage signal (e.g., the clamp signal 815) input to the digital-to-analog conversion unit 330. As an example, the clamp signal is a digital signal (e.g., the clamp signal 915) input to the counter unit 320. In some examples, the clamp signal is used to prevent the output signal 215 from further increment and/or further decrement.

According to some embodiments, a system for error amplification and processing includes: a signal processing unit configured to receive a reference signal and a feedback signal and generate a digital pulse signal, a frequency of the digital pulse signal being associated with a difference between the reference signal and the feedback signal; a counter configured to receive the digital pulse signal and generate a counter output signal based on at least information associated with the digital pulse signal; and a digital-to-analog converter configured to receive the counter output signal and generate an output signal based on at least information associated with the counter output signal. For example, the system for error amplification and processing is implemented according to at least FIG. 2 and/or FIG. 3.

In certain examples, the signal processing unit includes: an error amplifier configured to receive the reference signal and the feedback signal and generate an amplification signal based on at least information associated with the reference signal and the feedback signal; and a pulse generator configured to receive the amplification signal and generate the digital pulse signal based on at least information associated with the amplification signal. In some examples, the error amplifier includes a transconductance amplifier. In certain examples, the frequency of the digital pulse signal is proportional to a magnitude of the amplification signal. In some examples, wherein: the digital pulse signal includes an addition pulse signal and a subtraction pulse signal. In certain examples, the addition pulse signal includes one or more digital pulses based at least in part on a direction of the amplification signal; and the subtraction pulse signal includes one or more digital pulses based at least in part on the direction of the amplification signal.

In some examples, wherein: the pulse generator includes a current direction switch configured to determine a direction of the amplification signal; and the current direction switch is configured to receive the amplification signal and generate a current switch output signal based on information associated with the amplification signal. In certain examples, the current direction switch includes an inverter, a first transistor, and a second transistor; the inverter is configured to receive the amplification signal from the error amplifier; the first transistor is turned on or off based at least in part on the direction of the amplification signal; and the second transistor is turned on or off based at least in part on the direction of the amplification signal. In some examples, the pulse generator further includes an addition pulse generator; the addition pulse generator is configured to receive the current switch output signal and generate an addition pulse signal based at least in part on the current switch output signal; and the addition pulse signal is a part of the digital pulse signal.

In certain examples, wherein: the addition pulse generator includes a third transistor, a fourth transistor, a first capacitor, a first switch, a first comparator, and a first delay element; the third transistor and the fourth transistor are configured to receive the current switch output signal and generate a first voltage signal based at least in part on the current switch output signal; the first capacitor is configured to receive the first voltage signal; the first comparator is configured to receive the first voltage signal and a first threshold signal and generate the addition pulse signal based at least in part on the first voltage signal and the first threshold signal; the first delay element is configured to receive the addition pulse signal and generate a first switch signal based on at least information associated with the additional pulse signal; and the first switch is configured to receive the first switch signal. In some examples, the addition pulse signal is at a first logic level if the first voltage signal is higher than the first reference signal.

In certain examples, wherein: the first switch signal is at the first logic level after a delay from when the addition pulse signal is at the first logic level; the first switch is configured to be turned on if the first switch signal is at the first logic level; and the first capacitor is configured to be discharged when the first switch is turned on. In some examples, the addition pulse signal is at a second logic level if the first voltage signal is lower than the first reference signal. In certain examples, wherein: the first switch signal is at the second logic level after a delay when the addition pulse signal is at the second logic level; the first switch is configured to be turned off if the first switch signal is at the second logic level; and the first capacitor is configured to be charged by the first voltage signal when the first switch is turned off. In some examples, wherein: the first logic level is a logic high level; and the second logic level is a logic low level. In certain examples, the third transistor and the fourth transistor are configured to form a first current mirror. In some examples, in response to the first transistor being turned off and the second transistor being turned on, the addition pulse generator is configured to receive the amplification signal.

In certain examples, wherein: the pulse generator further includes a subtraction pulse generator; the subtraction pulse generator is configured to receive the current switch output signal and generate a subtraction pulse signal based at least in part on the current switch output signal; and the subtraction pulse signal is a part of the digital pulse signal. In some examples, wherein: the subtraction pulse generator includes a fifth transistor, a sixth transistor, a second capacitor, a second switch, a second comparator, and a second delay element; the fifth transistor and the sixth transistor are configured to receive the current switch output signal and generate a second voltage signal based at least in part on the current switch output signal; the second capacitor is configured to receive the second voltage signal; the second comparator is configured to receive the second voltage signal and a second threshold signal and generate the subtraction pulse signal based at least in part on the second voltage signal and the second threshold signal; the second delay element is configured to receive the subtraction pulse signal and generate a second switch signal based on at least information associated with the subtraction pulse signal; and the second switch is configured to receive the second switch signal. In certain examples, the subtraction pulse signal is at a first logic level if the second voltage signal is higher than the second reference signal.

In some examples, wherein: the second switch signal is at the first logic level after a delay from when the subtraction pulse signal is at the first logic level; the second switch is configured to be turned on if second first switch signal is at the first logic level; and the second capacitor is configured to be discharged when the second switch is turned on. In certain examples, the subtraction pulse signal is at a second logic level if the second voltage signal is lower than the second reference signal. In some examples, wherein: the second switch signal is at the second logic level after a delay from when the subtraction pulse signal is at the second logic level; the second switch is configured to be turned off if the second switch signal is at the second logic level; and the second capacitor is configured to be charged by the second voltage signal when the second switch is turned off. In certain examples, wherein: the first logic level is a logic high level; and the second logic level is a logic low level.

In some examples, the fifth transistor and the sixth transistor are configured to form a second current mirror. In certain examples, in response to the first transistor being turned on and the second transistor being turned off, the subtraction pulse generator is configured to receive the amplification signal. In some examples, the first capacitor has a first capacitance value; the second capacitor has a second capacitance value; and the first capacitance value is equal to the second capacitance value.

According to certain embodiments, a system for error amplification and processing includes: a signal processing unit configured to receive a reference signal and a feedback signal and generate a digital pulse signal, a frequency of the digital pulse signal being associated with a difference between the reference signal and the feedback signal; a counter configured to receive the digital pulse signal and generate a counter output signal based on at least information associated with the digital pulse signal; a digital-to-analog converter configured to receive the counter output signal and generate an output signal based on at least information associated with the counter output signal; and a clamp signal generator configured to receive the output signal and generate a clamp signal based on at least information associated with the output signal. For example, the system for error amplification and processing is implemented according to at least FIG. 2, FIG. 8, and/or FIG. 9.

In some examples, the digital-to-analog converter is configured to receive the clamp signal and generate the output signal based at least in part on the clamp signal. In certain examples, the clamp signal is a voltage signal. In some examples, the counter is configured to receive the clamp signal and generate the counter output signal based at least in part on the clamp signal. In certain examples, the clamp signal is a digital signal.

In some examples, wherein the signal processing unit includes: an error amplifier configured to receive the reference signal and the feedback signal and generate an amplification signal based on at least information associated with the reference signal and the feedback signal; and a pulse generator configured to receive the amplification signal and generate the digital pulse signal based on at least information associated with the amplification signal. In certain examples, the error amplifier includes a transconductance amplifier. In some examples, the frequency of the digital pulse signal is proportional to a magnitude of the amplification signal. In certain examples the digital pulse signal includes an addition pulse signal and a subtraction pulse signal. In some examples, wherein: the addition pulse signal includes one or more digital pulses based at least in part on a direction of the amplification signal; and the subtraction pulse signal includes one or more digital pulses based at least in part on the direction of the amplification signal.

In certain examples, wherein: the pulse generator includes a current direction switch configured to determine a direction of the amplification signal; and the current direction switch is configured to receive the amplification signal and generate a current switch output signal based on information associated with the amplification signal. In some examples, wherein: the current direction switch comprises an inverter, a first transistor, and a second transistor; the inverter is configured to receive the amplification signal from the error amplifier; the first transistor is turned on or off based at least in part on the direction of the amplification signal; and the second transistor is turned on or off based at least in part on the direction of the amplification signal. In certain examples, wherein: the pulse generator further includes an addition pulse generator; the addition pulse generator is configured to receive the current switch output signal and generate an addition pulse signal based at least in part on the current switch output signal; and the addition pulse signal is a part of the digital pulse signal. In some examples, wherein: the addition pulse generator includes a third transistor, a fourth transistor, a first capacitor, a first switch, a first comparator, and a first delay element; the third transistor and the fourth transistor are configured to receive the current switch output signal and generate a first voltage signal based at least in part on the current switch output signal; the first capacitor is configured to receive the first voltage signal; the first comparator is configured to receive the first voltage signal and a first threshold signal and generate the addition pulse signal based at least in part on the first voltage signal and the first threshold signal; the first delay element is configured to receive the addition pulse signal and generate a first switch signal based on at least information associated with the additional pulse signal; and the first switch is configured to receive the first switch signal.

In certain examples, the addition pulse signal is at a first logic level if the first voltage signal is higher than the first reference signal. In some examples, wherein: the first switch signal is at the first logic level after a delay from when the addition pulse signal is at the first logic level; the first switch is configured to be turned on if the first switch signal is at the first logic level; and the first capacitor is configured to be discharged when the first switch is turned on. In certain examples, the addition pulse signal is at a second logic level if the first voltage signal is lower than the first reference signal. In some examples, wherein: the first switch signal is at the second logic level after a delay from when the addition pulse signal is at the second logic level; the first switch is configured to be turned off if the first switch signal is at the second logic level; and the first capacitor is configured to be charged by the first voltage signal when the first switch is turned off. In certain examples, wherein: the first logic level is a logic high level; and the second logic level is a logic low level. In some examples the third transistor and the fourth transistor are configured to form a first current mirror. In certain examples, in response to the first transistor being turned off and the second transistor being turned on, the addition pulse generator is configured to receive the amplification signal.

In some examples, wherein: the pulse generator further includes a subtraction pulse generator; the subtraction pulse generator is configured to receive the current switch output signal and generate a subtraction pulse signal based at least in part on the current switch output signal; and the subtraction pulse signal is a part of the digital pulse signal. In certain examples, wherein: the subtraction pulse generator includes a fifth transistor, a sixth transistor, a second capacitor, a second switch, a second comparator, and a second delay element; the fifth transistor and the sixth transistor are configured to receive the current switch output signal and generate a second voltage signal based at least in part on the current switch output signal; the second capacitor is configured to receive the second voltage signal; the second comparator is configured to receive the second voltage signal and a second threshold signal and generate the subtraction pulse signal based at least in part on the second voltage signal and the second threshold signal; the second delay element is configured to receive the subtraction pulse signal and generate a second switch signal based on at least information associated with the subtraction pulse signal; and the second switch is configured to receive the second switch signal. In some examples, the subtraction pulse signal is at a first logic level if the second voltage signal is higher than the second reference signal.

In certain examples, wherein: the second switch signal is at the first logic level after a delay from when the subtraction pulse signal is at the first logic level; the second switch is configured to be turned on if second first switch signal is at the first logic level; and the second capacitor is configured to be discharged when the second switch is turned on. In some examples, the subtraction pulse signal is at a second logic level if the second voltage signal is lower than the second reference signal. In certain examples, wherein: the second switch signal is at the second logic level after a delay from when the subtraction pulse signal is at the second logic level; the second switch is configured to be turned off if the second switch signal is at the second logic level; and the second capacitor is configured to be charged by the second voltage signal when the second switch is turned off. In some examples, wherein: the first logic level is a logic high level; and the second logic level is a logic low level.

In certain examples, the fifth transistor and the sixth transistor are configured to form a second current mirror. In some examples, in response to the first transistor being turned on and the second transistor being turned off, the subtraction pulse generator is configured to receive the amplification signal. In certain examples, wherein: the first capacitor has a first capacitance value; the second capacitor has a second capacitance value; and the first capacitance value is equal to the second capacitance value.

According to some embodiments, a method for error amplification and processing, the method comprising: receiving a reference signal; receiving a feedback signal; generating a digital pulse signal, a frequency of the digital pulse signal being associated with a difference between the reference signal and the feedback signal; receiving the digital pulse signal; generating a counter output signal based on at least information associated with the digital pulse signal; receiving the counter output signal; and generating an output signal based on at least information associated with the counter output signal. For example, the method for error amplification and processing is implemented according to at least FIG. 2 and/or FIG. 3.

According to certain embodiments, a method for error amplification and processing includes: receiving a reference signal; receiving a feedback signal; generating a digital pulse signal, a frequency of the digital pulse signal being associated with a difference between the reference signal and the feedback signal; receiving the digital pulse signal; generating a counter output signal based on at least information associated with the digital pulse signal; receiving the counter output signal; generating an output signal based on at least information associated with the counter output signal; receiving the output signal; and generating a clamp signal based on at least information associated with the output signal. For example, the method for error amplification and processing is implemented according to at least FIG. 2, FIG. 8, and/or FIG. 9.

For example, some or all components of various embodiments of the present invention each are, individually and/or in combination with at least another component, implemented using one or more software components, one or more hardware components, and/or one or more combinations of software and hardware components. As an example, some or all components of various embodiments of the present invention each are, individually and/or in combination with at least another component, implemented in one or more circuits, such as one or more analog circuits and/or one or more digital circuits. For example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments.

What is claimed is:

1. A system for error amplification and processing, the system comprising:
    a signal processing unit configured to receive a reference signal and a feedback signal and generate a digital pulse signal, a frequency of the digital pulse signal being associated with a difference between the reference signal and the feedback signal;
    a counter configured to receive the digital pulse signal and generate a counter output signal based on at least information associated with the digital pulse signal; and
    a digital-to-analog converter configured to receive the counter output signal and generate an output signal based on at least information associated with the counter output signal;
    wherein the signal processing unit comprises:
        an error amplifier configured to receive the reference signal and the feedback signal and generate an amplification signal based on at least information associated with the reference signal and the feedback signal; and
        a pulse generator configured to receive the amplification signal and generate the digital pulse signal based on at least information associated with the amplification signal;

wherein:
the pulse generator includes a current direction switch configured to determine a direction of the amplification signal; and
the current direction switch is configured to receive the amplification signal and generate a current switch output signal based on information associated with the amplification signal;
wherein:
the current direction switch comprises an inverter, a first transistor, and a second transistor;
the inverter is configured to receive the amplification signal from the error amplifier; and
the first transistor is turned on or off based at least in part on the direction of the amplification signal;
wherein:
the second transistor is turned on or off based at least in part on the direction of the amplification signal;
the pulse generator further includes an addition pulse generator;
the addition pulse generator is configured to receive the current switch output signal and generate an addition pulse signal based at least in part on the current switch output signal; and
the addition pulse signal is a part of the digital pulse signal;
wherein:
the addition pulse generator includes a third transistor, a fourth transistor, a first capacitor, a first switch, a first comparator, and a first delay element;
the third transistor and the fourth transistor are configured to receive the current switch output signal and generate a first voltage signal based at least in part on the current switch output signal;
the first capacitor is configured to receive the first voltage signal;
the first comparator is configured to receive the first voltage signal and a first threshold signal and generate the addition pulse signal based at least in part on the first voltage signal and the first threshold signal;
the first delay element is configured to receive the addition pulse signal and generate a first switch signal based on at least information associated with the additional pulse signal; and
the first switch is configured to receive the first switch signal.

2. The system of claim 1, wherein the error amplifier includes a transconductance amplifier.

3. The system of claim 1, wherein the frequency of the digital pulse signal is proportional to a magnitude of the amplification signal.

4. The system of claim 1, wherein the digital pulse signal includes an addition pulse signal and a subtraction pulse signal.

5. The system of claim 4, wherein:
the addition pulse signal includes one or more digital pulses based at least in part on a direction of the amplification signal; and
the subtraction pulse signal includes one or more digital pulses based at least in part on the direction of the amplification signal.

6. The system of claim 1, wherein the addition pulse signal is at a first logic level if the first voltage signal is higher than the first reference signal.

7. The system of claim 6, wherein:
the first switch signal is at the first logic level after a delay from when the addition pulse signal is at the first logic level;
the first switch is configured to be turned on if the first switch signal is at the first logic level; and
the first capacitor is configured to be discharged when the first switch is turned on.

8. The system of claim 7, wherein the addition pulse signal is at a second logic level if the first voltage signal is lower than the first reference signal.

9. The system of claim 8, wherein:
the first switch signal is at the second logic level after a delay when the addition pulse signal is at the second logic level;
the first switch is configured to be turned off if the first switch signal is at the second logic level; and
the first capacitor is configured to be charged by the first voltage signal when the first switch is turned off.

10. The system of claim 8, wherein:
the first logic level is a logic high level; and
the second logic level is a logic low level.

11. The system of claim 1, wherein the third transistor and the fourth transistor are configured to form a first current mirror.

12. The system of claim 1, wherein in response to the first transistor being turned off and the second transistor being turned on, the addition pulse generator is configured to receive the amplification signal.

13. The system of claim 1, wherein:
the subtraction pulse generator is configured to receive the current switch output signal and generate a subtraction pulse signal based at least in part on the current switch output signal; and
the subtraction pulse signal is a part of the digital pulse signal.

14. The system of claim 13, wherein:
the subtraction pulse generator includes a fifth transistor, a sixth transistor, a second capacitor, a second switch, a second comparator, and a second delay element;
the fifth transistor and the sixth transistor are configured to receive the current switch output signal and generate a second voltage signal based at least in part on the current switch output signal;
the second capacitor is configured to receive the second voltage signal;
the second comparator is configured to receive the second voltage signal and a second threshold signal and generate the subtraction pulse signal based at least in part on the second voltage signal and the second threshold signal;
the second delay element is configured to receive the subtraction pulse signal and generate a second switch signal based on at least information associated with the subtraction pulse signal; and
the second switch is configured to receive the second switch signal.

15. The system of claim 14, wherein the subtraction pulse signal is at a first logic level if the second voltage signal is higher than the second reference signal.

16. The system of claim 15, wherein:
the second switch signal is at the first logic level after a delay from when the subtraction pulse signal is at the first logic level;
the second switch is configured to be turned on if second first switch signal is at the first logic level; and
the second capacitor is configured to be discharged when the second switch is turned on.

17. The system of claim 16, wherein the subtraction pulse signal is at a second logic level if the second voltage signal is lower than the second reference signal.

18. The system of claim 17, wherein:
the second switch signal is at the second logic level after a delay from when the subtraction pulse signal is at the second logic level;
the second switch is configured to be turned off if the second switch signal is at the second logic level; and
the second capacitor is configured to be charged by the second voltage signal when the second switch is turned off.

19. The system of claim 17, wherein:
the first logic level is a logic high level; and
the second logic level is a logic low level.

20. The system of claim 14, wherein the fifth transistor and the sixth transistor are configured to form a second current mirror.

21. The system of claim 14, wherein in response to the first transistor being turned on and the second transistor being turned off, the subtraction pulse generator is configured to receive the amplification signal.

22. The system of claim 14, wherein:
the first capacitor has a first capacitance value;
the second capacitor has a second capacitance value; and
the first capacitance value is equal to the second capacitance value.

23. A method for error amplification and processing, the method comprising:
receiving a reference signal;
receiving a feedback signal;
generating, by a signal processing unit, a digital pulse signal, a frequency of the digital pulse signal being associated with a difference between the reference signal and the feedback signal;
receiving the digital pulse signal;
generating a counter output signal based on at least information associated with the digital pulse signal;
receiving the counter output signal; and
generating an output signal based on at least information associated with the counter output signal;
wherein the generating a digital pulse signal includes:
generating an amplification signal based on at least information associated with the reference signal and the feedback signal;
receiving, by a pulse generator the amplification signal; and
generating, by the pulse generator, the digital pulse signal based on at least information associated with the amplification signal;
wherein the receiving the amplification signal includes:
receiving the amplification signal by a current direction switch configured to determine a direction of the amplification signal, and
generating a current switch output signal based on information associated with the amplification signal;
wherein:
the current direction switch comprises an inverter, a first transistor, and a second transistor;
the inverter is configured to receive the amplification signal from the error amplifier; and
the first transistor is turned on or off based at least in part on the direction of the amplification signal;
wherein:
the second transistor is turned on or off based at least in part on the direction of the amplification signal;
the pulse generator further includes an addition pulse generator;
the addition pulse generator is configured to receive the current switch output signal and generate an addition pulse signal based at least in part on the current switch output signal; and
the addition pulse signal is a part of the digital pulse signal;
wherein:
the addition pulse generator includes a third transistor, a fourth transistor, a first capacitor, a first switch, a first comparator, and a first delay element;
the third transistor and the fourth transistor are configured to receive the current switch output signal and generate a first voltage signal based at least in part on the current switch output signal;
the first capacitor is configured to receive the first voltage signal;
the first comparator is configured to receive the first voltage signal and a first threshold signal and generate the addition pulse signal based at least in part on the first voltage signal and the first threshold signal;
the first delay element is configured to receive the addition pulse signal and generate a first switch signal based on at least information associated with the additional pulse signal; and
the first switch is configured to receive the first switch signal.

* * * * *